(12) United States Patent
Torii

(10) Patent No.: US 6,947,326 B2
(45) Date of Patent: Sep. 20, 2005

(54) NONVOLATILE SEMICONDUCTOR MEMORY AND METHOD OF OPERATING THE SAME

(75) Inventor: Satoshi Torii, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/618,712

(22) Filed: Jul. 15, 2003

(65) Prior Publication Data

US 2004/0013000 A1 Jan. 22, 2004

(30) Foreign Application Priority Data

Jul. 16, 2002 (JP) ........................................ 2002-206904

(51) Int. Cl.[7] .............................................. G11C 16/06
(52) U.S. Cl. ........................... 365/185.22; 365/185.2; 365/185.28; 365/185.29
(58) Field of Search .................. 365/185.22, 185.2, 365/185.28, 185.29

(56) References Cited

U.S. PATENT DOCUMENTS

| | | | | |
|---|---|---|---|---|
| 5,617,359 A | * | 4/1997 | Ninomiya ............... | 365/185.29 |
| 5,784,318 A | * | 7/1998 | Anami .................. | 365/185.22 |
| 5,812,451 A | | 9/1998 | Iwata | |
| 5,844,843 A | * | 12/1998 | Matsubara et al. .... | 365/185.24 |
| 6,076,138 A | * | 6/2000 | Shin .......................... | 711/103 |
| 6,438,036 B2 | * | 8/2002 | Seki et al. ............. | 365/185.22 |
| 6,493,265 B2 | * | 12/2002 | Satoh et al. ........... | 365/185.21 |

FOREIGN PATENT DOCUMENTS

| | | |
|---|---|---|
| EP | 1 182 669 | 2/2002 |
| JP | 2000-174235 | 6/2000 |
| JP | 2001-325793 | 11/2001 |

\* cited by examiner

*Primary Examiner*—Hoai Ho
(74) *Attorney, Agent, or Firm*—Westerman, Hattori, Daniels & Adrian, LLP

(57) ABSTRACT

A first decision process, which reads data from a memory cell under a first deciding condition to decide pass/fail and applies a signal to the memory cell to change an amount of charge stored in the memory cell if the data is decided as fail, and a second decision process, which reads the data from the memory cell under a second deciding condition that is relaxed rather than the first deciding condition to decide the pass/fail, are executed, and then the processes are repeated from the first decision process when the data is decided as fail in the second decision process.

10 Claims, 18 Drawing Sheets

ERASE VERIFICATION

NONVOLATILE SEMICONDUCTOR MEMORY AND METHOD OF OPERATING THE SAME

CROSS-REFERENCE TO RELATED APPLICATIONS

This application is based upon and claims priority of Japanese Patent Applications No. 2002-206904, filed in Jul. 16, 2002, the contents being incorporated herein by reference.

BACKGROUND OF THE INVENTION

1. Field of the Invention

The present invention relates to a nonvolatile semiconductor memory such as EEPROM (Electrically Erasable Programmable Read Only Memory), a flash memory (collectively electrically erasable EEPROM), etc. and a method of operating the same and, more particularly, a nonvolatile semiconductor memory capable of assuring stable write verification and erase verification when a decision current or a decision voltage is varied due to a power supply noise and other causes, and a method of operating the same.

2. Description of the Prior Art

In recent years, multi-functioning and size reduction of the electronic device are accelerated, and thus miniaturization of the semiconductor integrated circuit is required much more correspondingly. In the nonvolatile semiconductor memory such as EEPROM, the flash memory, etc., not only the miniaturization of the memory cell but also the stable detection of smaller change in the threshold voltage is required.

In the meanwhile, the memory whose substantial cell area can be reduced without shrinkage in the dimension of the memory cell and which can respond to the multi-level operation has also been developed. In the normal semiconductor memory, only two states of "0" or "1" can be stored in one memory cell. While, in the multi-level memory, three states or more can be stored in one memory cell. In this case, in the multi-level memory, the threshold voltage must be strictly controlled in response to the stored data. In future, in order to respond to the higher functioning and size reduction of the electronic device, the multi-level memory will be positively employed.

As the nonvolatile semiconductor memory in the prior art, the floating gate memory having the dual gate structure, in which two gate electrodes of the floating gate and the control gate are formed to put the thin insulating film therebetween, is used commonly. The floating gate memory is set forth in Patent Application Publication (KOKAI) 2000-174235, for example.

However, in recent years, complicated manufacturing processes required for the dual gate structure becomes conspicuous as the obstacle to the miniaturization. For this reason, the single gate nonvolatile semiconductor memory having one gate electrode is watched with interest. In the single gate nonvolatile semiconductor memory, the material that can store the charge therein is employed as the gate insulating film that is formed between the semiconductor substrate and the gate electrode, and then data are stored by utilizing such a phenomenon that the threshold voltage is changed according to an amount of charge stored in the gate insulating film.

As one of such single gate nonvolatile semiconductor memories, there is the SONOS (Silicon Oxide Nitride Oxide Silicon) memory. This SONOS memory is set forth in Patent Application Publication (KOKAI) 2001-325793, for example.

In the SONOS memory, the insulating film having the laminated structure in which the silicon nitride (SiN) film is put between the silicon oxide ($SiO_2$) films vertically, for example, is employed as the gate insulating film. The storing and erasing of data are executed by loading/unloading the charge into/from the silicon nitride film.

In the SONOS memory, since an amount of trapped charge is smaller than the floating gate memory, an amount of shift of the threshold voltage is small. Also, in the SONOS memory, since a writing efficiency is low, a writing rate become slower than the floating gate memory. Therefore, in the single gate nonvolatile semiconductor memory such as the SONOS memory, it is important to detect a minute change in the threshold voltage during the writing and the erasing.

In this manner, in view of the tendency of the nonvolatile semiconductor memory in recent years, it is important to detect a minute change in the threshold voltage. However, such a problem is caused that, if an amount of change in the threshold voltage is small, the pass or the fail cannot be decided precisely in the verifying operation to check whether or not the writing and the erasing have been sufficiently executed.

More particularly, in the semiconductor memory, a current serving as a criterion or a current supplied from the memory cell is varied on a time-dependent basis by the influence of the external noise such as the power supply noise and others. Thus, in some cases a voltage that corresponds to a fluctuation level of the current caused by the influence of these noises become equal to an amount of change in the threshold voltage. As a result, in some cases the memory cell that has been decided once as the pass is decided as the fail in the next verification, and thus the writing or erasing operation (loop) must be executed once again. In this case, if there is the memory cell that has been decided as the fail in the second verifying operation, the writing or erasing operation (loop) must be further executed. In this manner, in the nonvolatile semiconductor memory in the prior art, the pass/fail decision becomes unreliable by the influence of the power supply noise and others, and thus it is possible that the verifying operation should be executed many times.

FIG. 1 is a view showing a concept of verification in the prior art. It is assumed that a reference current I is varied only by $\pm\Delta I$. If a current Id of the memory cell is in excess of $I+\Delta I$, the memory cell is decided as the fail irrespective of the influence of the noise, and thus the writing is needed once again. If the current Id of the memory cell is below $I-\Delta I$, the memory cell is decided as the pass irrespective of the influence of the noise, and thus the second writing is not needed. However, if the current Id of the memory cell is in the range of $I-\Delta I<Id<I+\Delta I$, the pass/fail decision becomes unreliable because of the influence of the noise. As a result, sometimes the cell that has been decided as the pass in the first verification is decided as the fail in the next verification.

In the actual memory, as shown in a conceptual view of FIG. 2, there are three decision levels, i.e., the write decision level, the stored information decision level at the normal operation, and the erase decision level. The dead band in which the decision becomes unstable (the band indicated by a broken line in FIG. 2) exists at each decision level.

FIG. 3 is a flowchart showing the write verifying operation in the nonvolatile semiconductor memory in the prior art.

First, in step S11, a fail count is initialized (fail count=0). Then, in step S12, a start address is set in an address counter. In step S13, data is read from the memory cell whose address is the start address.

Then, the process goes to step S14 to decide whether or not a memory cell is the memory cell of which the data writing is required. If the memory cell is the memory cell of which the data writing is required, it is decided by comparing read data with a criterion whether or not the read data is fail. If the memory cell is the memory cell of which the data writing is required and the read data is fail (Yes), the process goes to step S15. In contrast, if the memory cell is the memory cell of which the data writing is not required or if the read data is pass (No), the process goes to step S17.

In step S15, a write pulse is applied the memory cell having the address. Then, the process goes to step S16 in which the number of fail count is incremented by 1. Then, the process goes to step S17.

In step S17, it is decided whether or not the address that is set in the address counter is the end address. If the address is not the end address, the process goes to step S18 to set the next address in the address counter. Then, the process goes back to step S13, the data is read from the memory cell that has the set address.

In this manner, the data is read sequentially from the memory cell having the start address through the memory cell having the end address to decide whether or not the memory cell is the memory cell of which the data writing is required and then decide whether or not the read data is fail if the memory cell is the memory cell of which the data writing is required. Then, an amount of charge stored in the memory cell that was decided as the fail is changed by applying a write pulse to the memory cell.

Then, the process goes from step S17 to step S19 to decide whether or not the number of fail count is 0. If the number of fail count is not 0, the process goes back to step S11 and then the above processes are repeated. If it is decided in step S19 that the number of fail count is 0, the verification is ended.

FIG. 4 is a flowchart showing the erase verifying operation in the nonvolatile semiconductor memory in the prior art.

First, in step S21, the fail count is initialized (fail count= 0). Then, in step S22, the start address is set in the address counter. In step S23, the data is read from the memory cell whose address is the start address.

Then, the process goes to step S24 wherein the read data is compared with the criterion to decide whether or not the read data is fail. If the read data is fail (Yes), the process goes to step S25. If the read data is pass (No), the process goes to step S26.

In step S25, the number of fail count is incremented by 1. Then, the process goes to step S26.

In step S26, it is decided whether or not the address that is set in the address counter is the end address. If the set address is not the end address, the process goes to step S27 wherein the next address is set in the address counter. Then, the process goes back to step S23 wherein the data is read from the memory cell that has the set address.

In this manner, the data is read sequentially from the memory cell having the start address through the memory cell having the end address to decide whether or not the read data is fail. The number of fail count is incremented every time when the fail is sensed.

Then, the process goes from step S26 to step S28 to decide whether or not the number of fail count is 0. If the number of fail count is not 0, the process goes to step S29 in which an erase pulse is applied collectively to all the memory cells that have the start address to the end address. Then, the process goes back to step S21, and the above processes are repeated. In addition, in the erase verification, as shown by a broken-line arrow in FIG. 4, there is also the case that the process goes directly to step S29 if the fail is detected in step S24.

As shown in FIG. 3 and FIG. 4, in the nonvolatile semiconductor memory in the prior art, if the fail occurs at the time of verification, the application of the write pulse or the erase pulse is repeated until the fail can be eliminated. As described above, it is impossible to say that, since sometimes the memory cell that was decided as the pass due to the influence of the noise, etc. is decided as the fail in the next verification, the nonvolatile semiconductor memory in the prior art has the sufficient reliability. Also, the process loop (processes in step S11 to step S19 or step S21 to step S29) is repeated many times until the fail can be eliminated. Thus, it takes a lot of time until the verification is completed.

SUMMARY OF THE INVENTION

It is an object of the present invention to provide a nonvolatile semiconductor memory capable of executing pass/fail decisions precisely when a decision current or a decision voltage is varied due to influence of a power supply noise and other noises, and a method of operating the same.

A nonvolatile semiconductor memory of the present invention comprises a nonvolatile memory cell for storing a charge in response to data; and a memory cell driving portion for driving the memory cell; wherein the memory cell driving portion executes a first decision process of deciding pass/fail of the data that is read from the memory cell under a first deciding condition and then applying a signal to the memory cell that is decided as fail to change an amount of charge stored in the memory cell, and a second decision process of deciding the pass/fail of the data that is read from the memory cell under a second deciding condition that is relaxed rather than the first deciding condition.

A nonvolatile semiconductor memory operating method of the present invention of executing data writing or data erasing in a nonvolatile memory cell while verifying the data of a nonvolatile memory cell, comprises a first decision process of reading the data from the memory cell under a first deciding condition to decide pass/fail, and applying a signal to the memory cell to change an amount of charge stored in the memory cell if the data is decided as fail; and a second decision process of reading the data from the memory cell under a second deciding condition, which is relaxed rather than the first deciding condition, to decide the pass/fail; wherein processes are repeated from the first decision process when the data is decided as fail in the second decision process.

In the prior art, both the pass/fail decision of the memory cell and the decision whether or not the writing is required are executed under the same condition. Therefore, when the voltage is varied due to the power supply noise, etc., the pass/fail decision becomes unreliable. Thus, as described above, such a problem is caused that the processing loop must be repeated many times.

For this reason, in the present invention, the pass/fail decision of the memory cell and the decision whether or not the writing or the erasing is required are executed under the different conditions. For example, in the data writing, first the first deciding process of deciding whether or not the writing is required under the relatively severe first deciding condition is executed, and then the writing process is applied to the memory cell of which the writing is required to change an amount of charge stored in the memory cell. As a result, the data is strengthened by injecting the charge much more to the memory cell that has such a possibility that its pass/fail decision become unreliable.

Then, the second deciding process of deciding the pass/ fail of the memory cell under the second deciding condition is executed. In the first deciding process, the data is strengthened by injecting the charge much more to the memory cell having the possibility such that the pass/fail decision become unreliable. Also, in the second deciding process, the pass/fail is decided under the second deciding condition that is relaxed rather than the first deciding condition. As a result, a possibility that the data of the memory cell becomes fail is very small in the second deciding process.

In this manner, because the pass/fail decision of the memory cell and the decision whether or not the writing or the erasing is required are executed under the different conditions, the pass/fail decision becomes precise irrespective of the noise, etc. Thus, an execution time of the data verifying process can be reduced extremely rather than the prior art.

DESCRIPTION OF THE PREFERRED EMBODIMENTS

Embodiments of the present invention will be explained with reference to the accompanying drawings hereinafter.

(First Embodiment)

Figure 1:
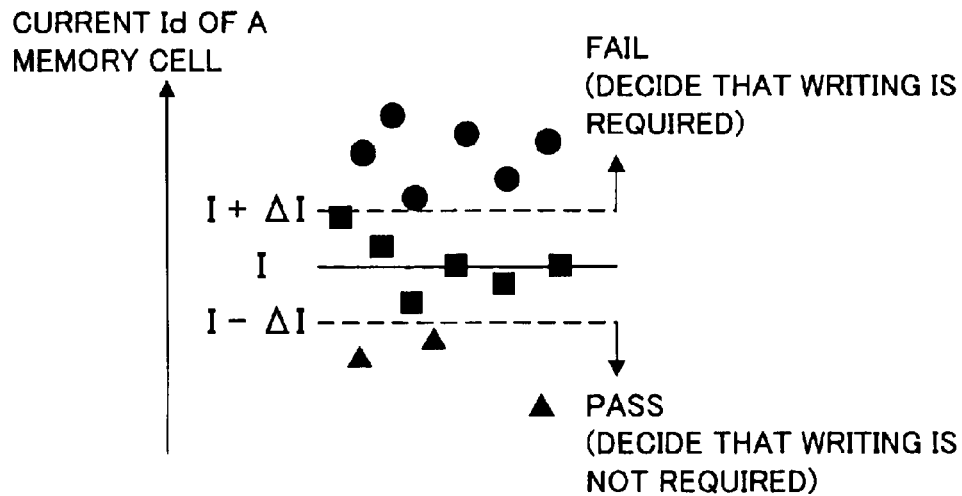
FIG. 1 is a view (#1) showing a concept of verification in the prior art.
Figure 2:
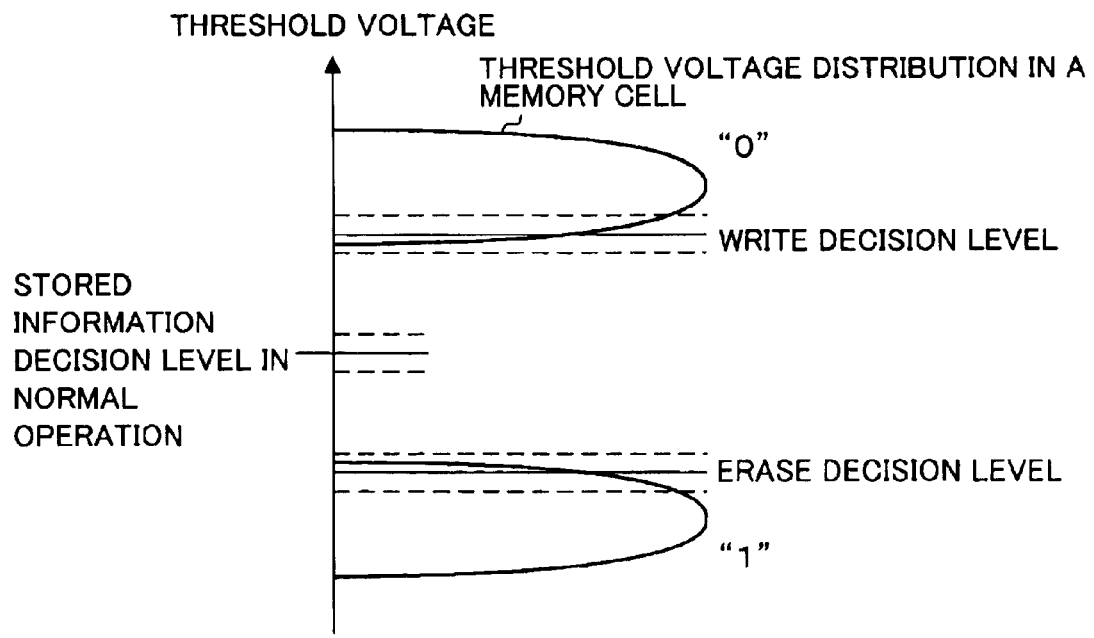
FIG. 2 is a view (#2) showing the concept of verification in the prior art.
Figure 3:
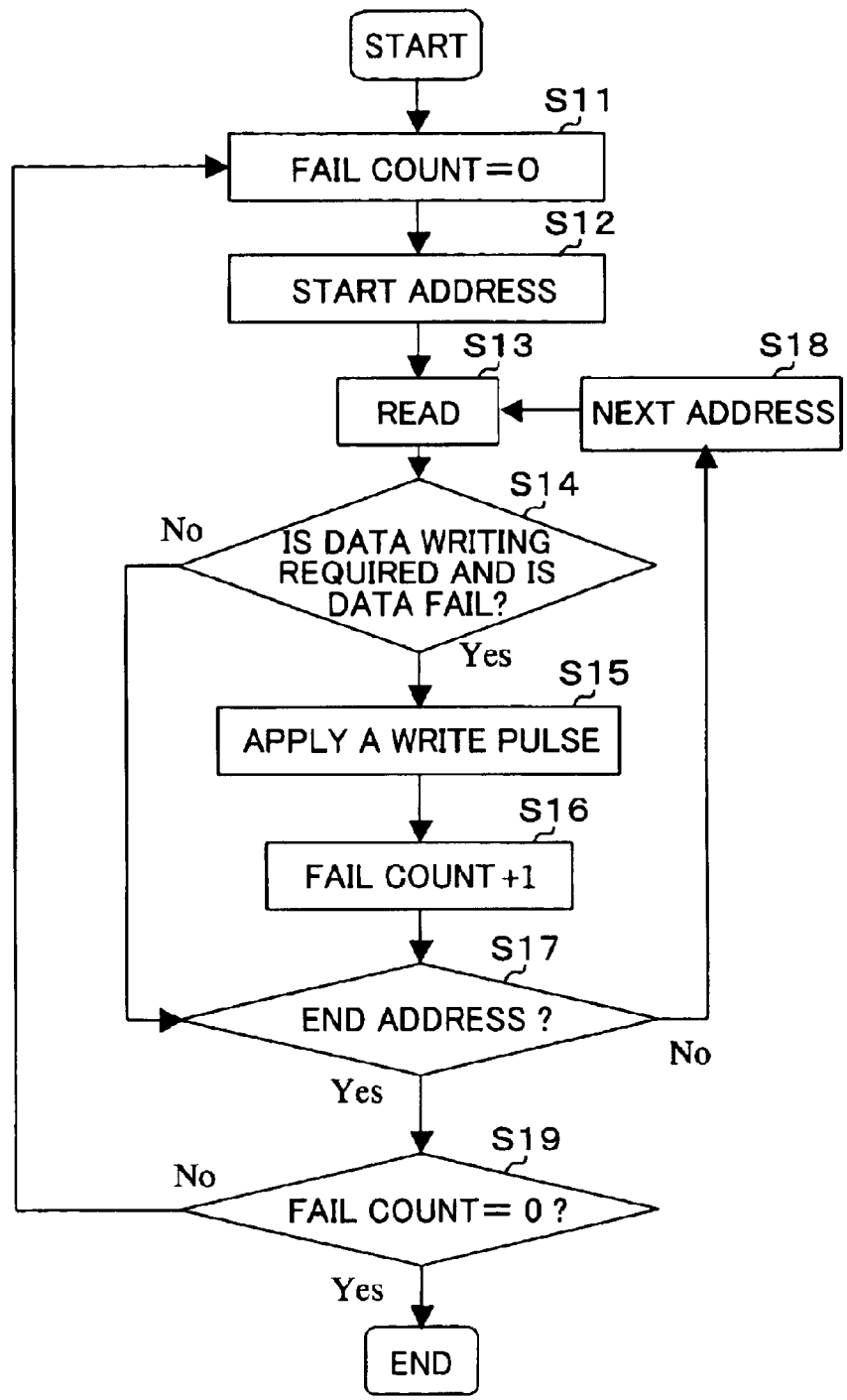
FIG. 3 is a flowchart showing a write verifying operation in a nonvolatile semiconductor memory in the prior art.
Figure 4:
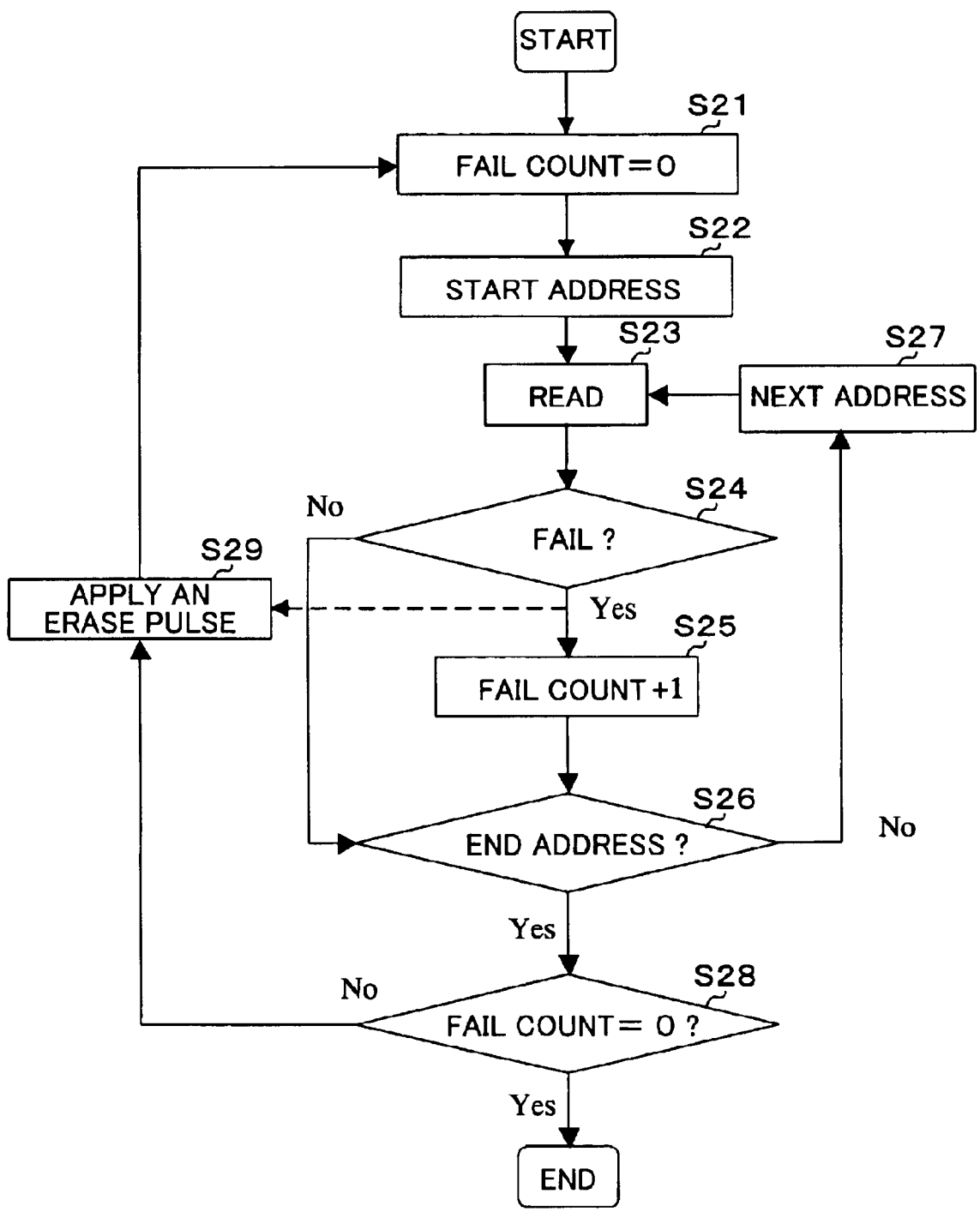
FIG. 4 is a flowchart showing an erase verifying operation in the nonvolatile semiconductor memory in the prior art.
Figure 5:
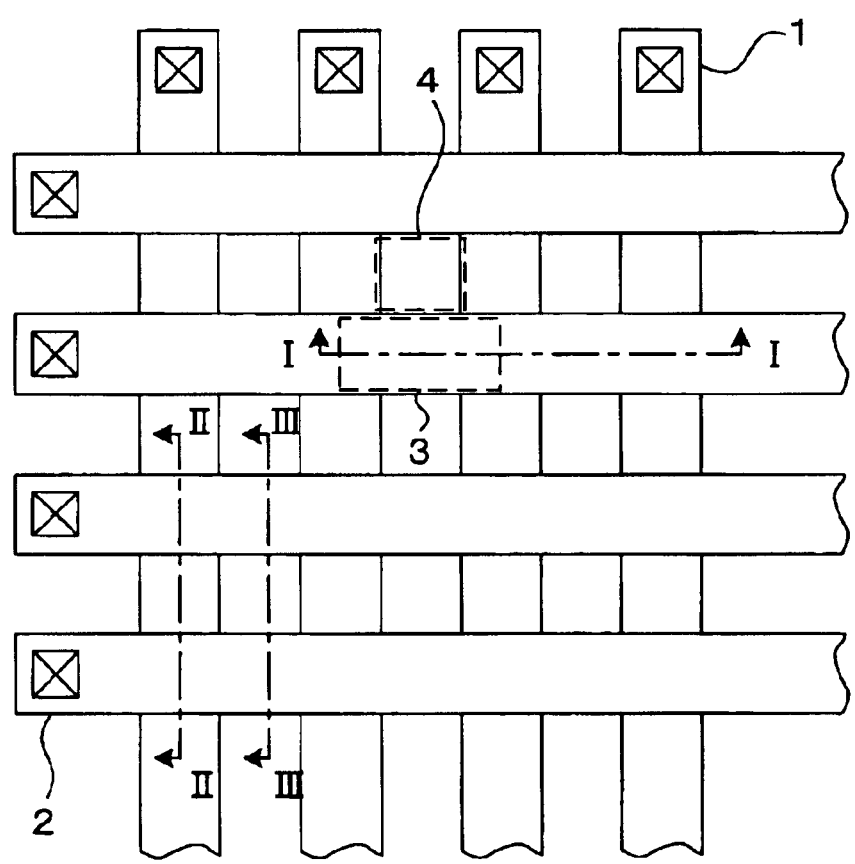
FIG. 5 is a plan view showing a memory cell forming portion of a SONOS nonvolatile semiconductor memory according to a first embodiment of the present invention.
Figure 6A:
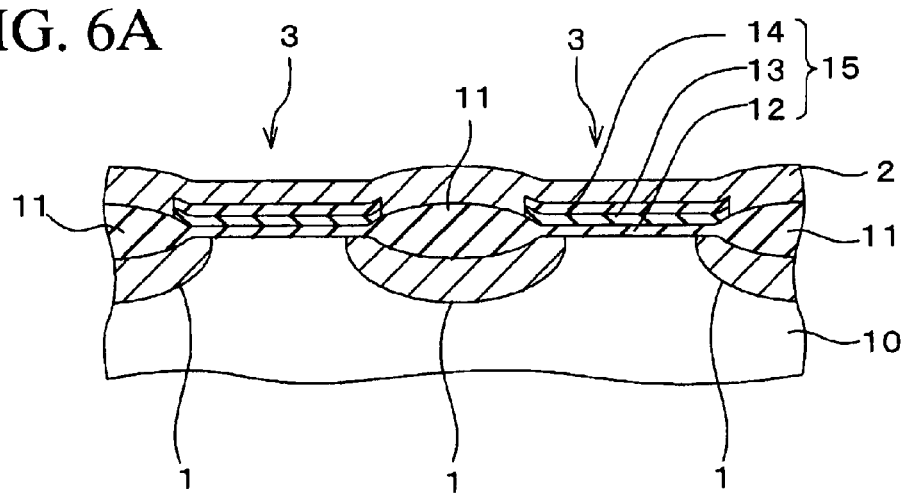
FIG. 6A is a sectional view taken along a I—I line in FIG. 5.
Figure 6B:
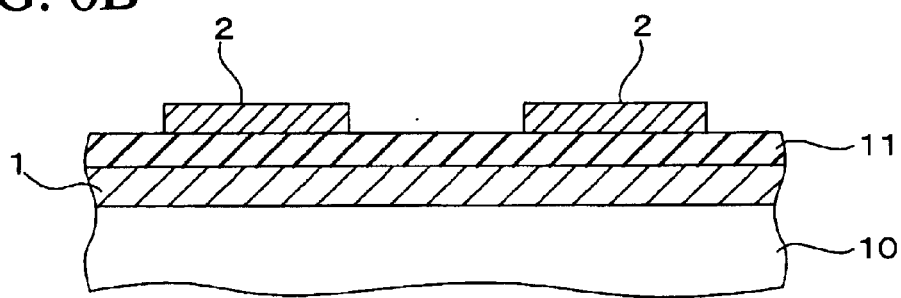
FIG. 6B is a sectional view taken along a II—II line in FIG. 5.
Figure 6C:
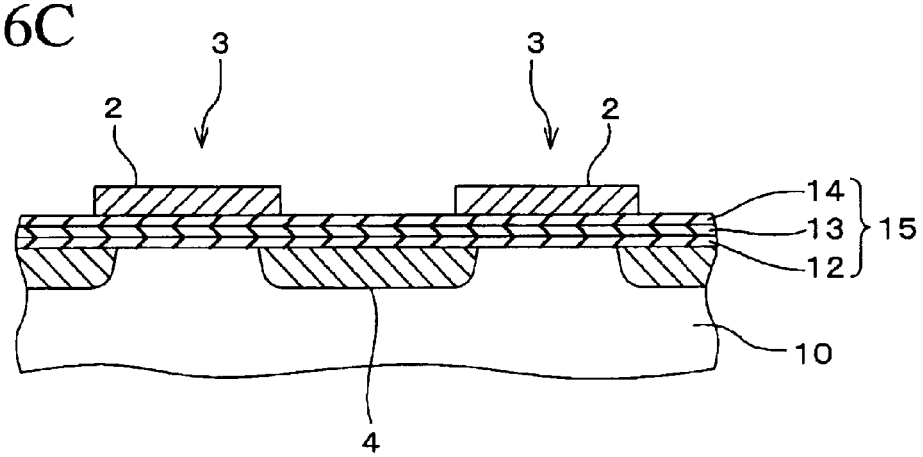
FIG. 6C is a sectional view taken along a III—III line in FIG. 5.

FIG. 5 is a plan view showing a memory cell forming portion of a SONOS nonvolatile semiconductor memory according to a first embodiment of the present invention. FIG. 6A is a sectional view taken along a I—I line in FIG. 5, FIG. 6B is a sectional view taken along a II—II line in FIG. 5, and FIG. 6C is a sectional view taken along a III—III line in FIG. 5.

A local insulating film 11 that defines an active region is formed on a surface of a p-type silicon substrate 10. This local insulating film 11 extends in the direction that is perpendicular to a sheet of FIG. 6A. A laminated gate insulating film 15 is formed on the active region of the silicon substrate 10. This laminated gate insulating film 15 has a triple-layered structure in which a silicon oxide film 12, a silicon nitride film 13, and a silicon oxide film 14 are laminated sequentially from the substrate 10 side. The charge that corresponds to the data is stored in the silicon nitride film 13.

A bit line 1 made of an impurity region, which is formed by introducing As (arsenic) into the silicon substrate 10, is arranged under the local insulating film 11. A word line 2 that extends in the lateral direction in FIG. 6A is formed on the local insulating film 11 and the laminated gate insulating film 15. This word line 2 has a laminated structure consisting of a polysilicon layer and a tungsten silicide (WSi) layer, for example.

The bit line 1 and the word line 2 are isolated mutually at their intersecting portion by the local insulating film 11. An FET (memory cell) 3 having a pair of bit lines 1 as the source and the drain and the word line 2 as the gate electrode respectively is formed at the position at which a portion located between a pair of neighboring bit lines 1 intersects with one word line 2.

A channel stopper region 4, which is formed by introducing the p-type impurity into the silicon substrate 10, is arranged between channel regions of two FETs 3 that are adjacent to each other in the direction along which the bit line 1 extends.

Figure 7:
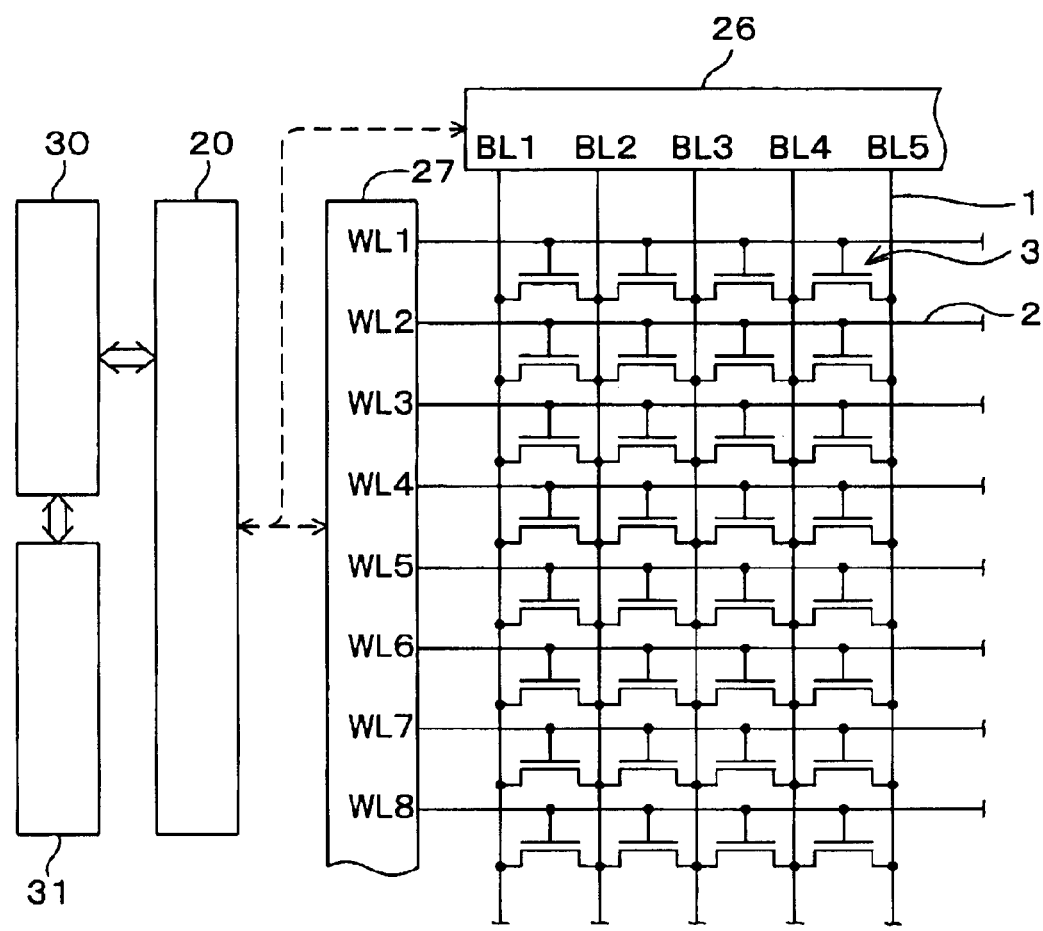
FIG. 7 is a block diagram showing a circuit configuration of the SONOS nonvolatile semiconductor memory.

FIG. 7 is a block diagram showing a circuit configuration of the SONOS nonvolatile semiconductor memory. The source and the drain of the FET 3 constituting one memory cell are connected to two neighboring bit lines 1 respectively, and the gate electrode is connected to the word line 2.

A plurality of memory cells are arranged in a matrix to constitute a memory cell array. The unique addresses are assigned to the memory cells respectively, and one memory cell is identified by the address information. The memory cell array is divided into a plurality of blocks, and each of the memory cells belongs to any one block.

The bit lines 1 are connected to a sense amplifier portion 26, and the word lines 2 are connected to a word line driver 27. A control circuit 20 controls the sense amplifier portion 26 and the word line driver 27. Here, the bit lines 1 are represented as BL1, BL2, BL3, BL4, . . . sequentially from the left in FIG. 7, and the word lines 2 are represented as WL1, WL2, WL3, WL4, . . . sequentially from the top in FIG. 7.

The control circuit 20 has the address counter (not shown). If the bit line and the word line that are connected to the memory cell, which is identified by the address being set in the address counter, are selected, the desired memory cell can be accessed.

The control circuit 20 is controlled by an external CPU 30. A RAM 31 is connected to the CPU 30. The RAM 31 stores temporarily the data to be written.

(Decision Circuit)

Figure 8:
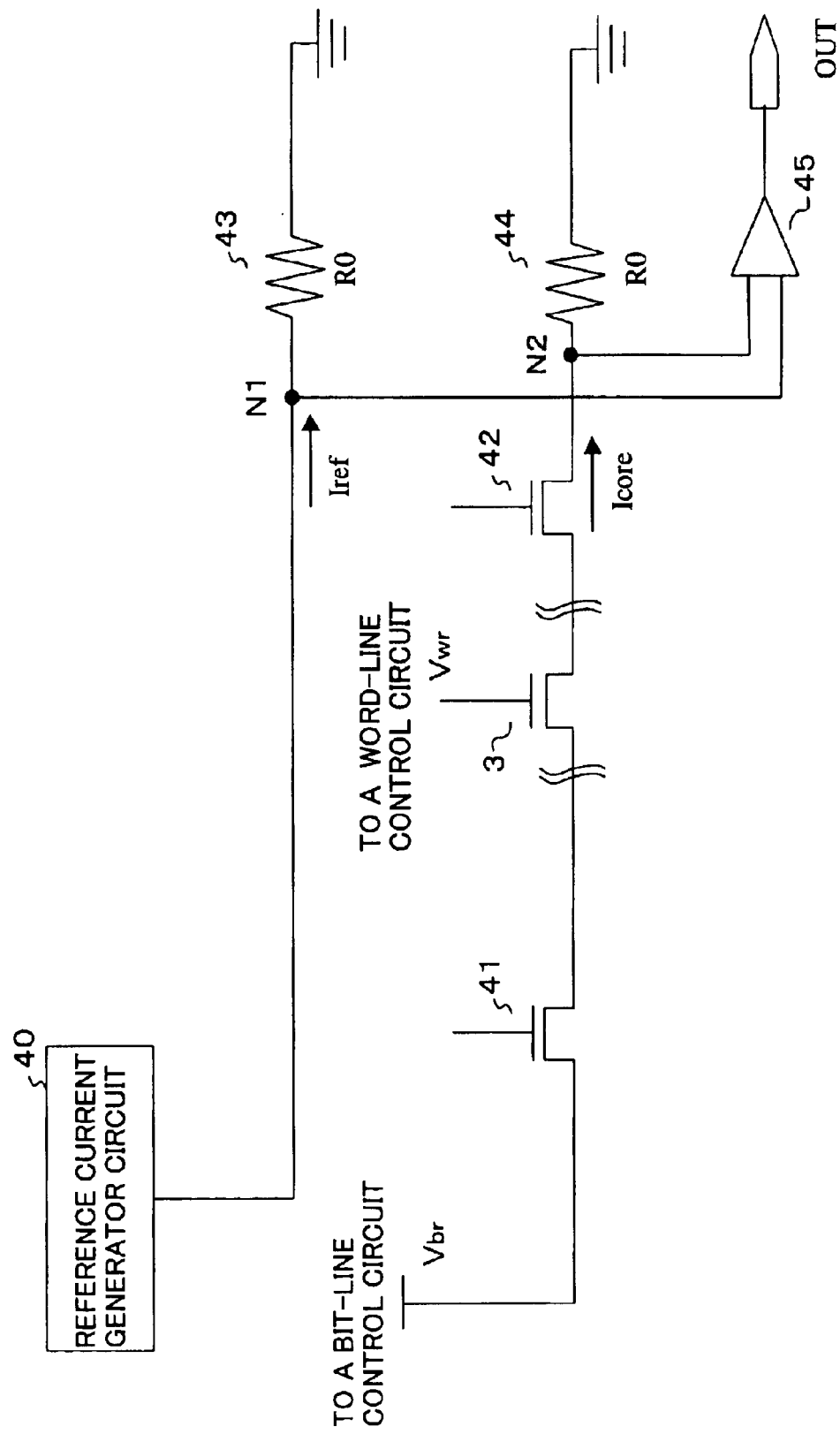
FIG. 8 is a circuit diagram showing a configuration of a pass/fail decision circuit provided in a sense amplifier portion of the nonvolatile semiconductor memory according to the first embodiment.

FIG. 8 is a circuit diagram showing a configuration of a pass/fail decision circuit provided in the sense amplifier portion 26 of the nonvolatile semiconductor memory according to the first embodiment.

A reference current generator circuit 40 generates a predetermined reference current Iref in response to a signal supplied from the control circuit 20. A resistor 43 whose resistance value is R0 is connected between the reference current generator circuit 40 and the ground. If the reference current Iref is supplied from the reference current generator circuit 40 to the resistor 43, a reference voltage (R0×Iref) is generated at a connection point N1 of the resistor 43 on the reference current generator circuit 40 side.

Also, selector gates (MOSFETs) 41, 42 are connected to the bit lines on the source side and the drain side of the memory cell respectively. These selector gates 41, 42 are turned ON/OFF in response to the signal from the control circuit 20. A resistor 44 whose resistance value is R0 is connected between the selector gate 42 and the ground.

For example, if the data that is written into the memory cell 3 is to be verified, a predetermined voltage Vwr is supplied to the gate (word line) of the memory cell 3 from a word-line control circuit (not shown) in the sense amplifier portion 26 and also a predetermined voltage Vbr is supplied to the drain of the memory cell 3 from a bit-line control circuit (not shown) in the sense amplifier portion 26 via the selector gate 41. Thus, a current (cell current) Icore, which responds to an amount of charge (data) stored in the gate insulating film, flows through the memory cell 3 and then a cell voltage (R0×Icore) is generated at a connection point N2 of the resistor 44 on the selector gate 42 side.

A sense amplifier 45 compares the cell voltage with a reference voltage to decide the pass/fail. Then, "1" is output if the data is decided as the fail whereas "0" is output if the data is decided as the pass.

An operation of the above SONOS nonvolatile semiconductor memory will be explained hereunder. The operation explained in the following is executed by the control circuit 20 in answer to the instruction supplied from the CPU 30.

(Data Writing Operation)

A data writing operation is carried out by applying a write voltage Vdp (=about 6 V) to the bit line 1 that is connected to the drain of the selected memory cell, applying 0 V to the bit line 1 that is connected to the source, and applying a voltage Vwp (=about 10 V) to the word line 2. At this time, the bit lines 1 and the word lines 2 of the unselected cells are floated to avoid the writing of data.

When the above data writing operation is carried out, a hot electron is generated in vicinity of the drain in the selected memory cell. The hot electron gets over the barrier of the silicon oxide film 12 and is trapped in the silicon nitride film 13. Thus, a threshold voltage of the selected memory cell (FET 3) is shifted to the positive direction. This state denotes the state that the data is written, i.e., "0".

(Data Erasing Operation)

A data erasing operation is applied collectively to all the memory cells in the selected block. The data erasing operation is carried out by applying a voltage Vwe (=about −6 V) to all the word lines 2 of the selected block and applying a voltage Vbe (=about 6 V) to all the bit lines 1. Thus, the electron that was trapped in the silicon nitride film 13 is discharged to the substrate 10 side, and the threshold voltage of the memory cell (FET 3) is shifted to the negative direction. This state denotes the state that the data is erased, i.e., "1".

(Data Reading Operation)

A data reading operation is carried out by applying a voltage Vwr (=about 4 V) to the word line 2 that is connected to the selected memory cell, applying a voltage Vbr (=about 1.4 V) to the bit line 1 that is connected to the drain, and applying 0 V to the bit line 1 that is connected to the source.

In this case, a relationship between the drain and the source in the data reading operation is inverted from a relationship between the drain and the source in the data writing operation. This is because the electron is trapped in vicinity of the diffusion layer used as the drain in the data writing operation and thus a threshold value of the memory cell (FET 3) is shifted largely in the data reading operation by inverting the drain and the source. As the result of the data reading operation, the current that flows through the selected memory cell is compared in amplitude with a decision current, and "0" or "1" is decided according to the compared result.

(Verification)

Figure 9:
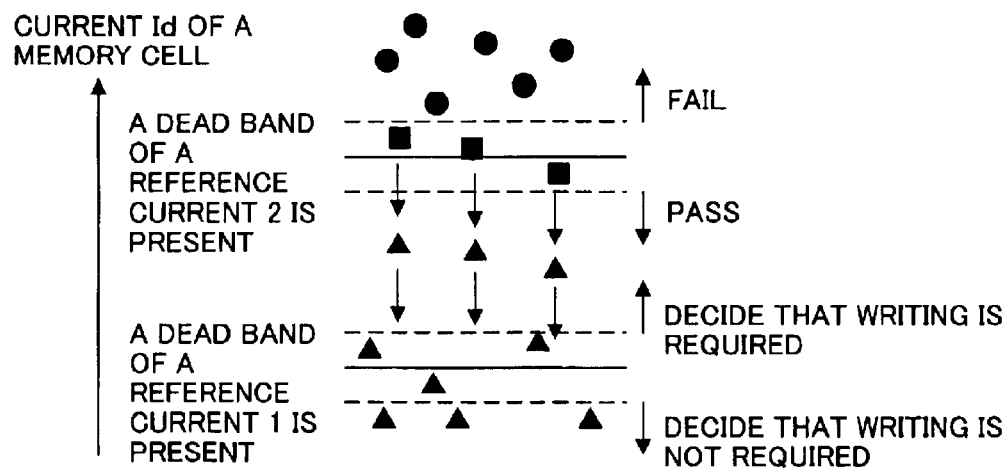
FIG. 9 is a view (#1) showing a concept of verification in the first embodiment.

FIG. 9 is a view showing a concept of verification in the first embodiment.

In the present embodiment, two types of reference currents (deciding conditions) of a reference current 1 and a reference current 2 are provided. The reference current 1 is used to decide whether or not the writing is required, and the reference current 2 is used to decide the pass/fail. The reference current 1 is set under the conditions that are more severe than the reference current 2.

In this case, the reference current 1 and the reference current 2 are varied due to the influence of the noise, etc. Here, variation ranges of the reference currents 1, 2 (indicated by a broken-line band in FIG. 9) are called a dead band respectively. It should be noted that the dead band of the reference current 1 and the dead band of the reference current 2 are set not to overlap with each other.

Figure 10:
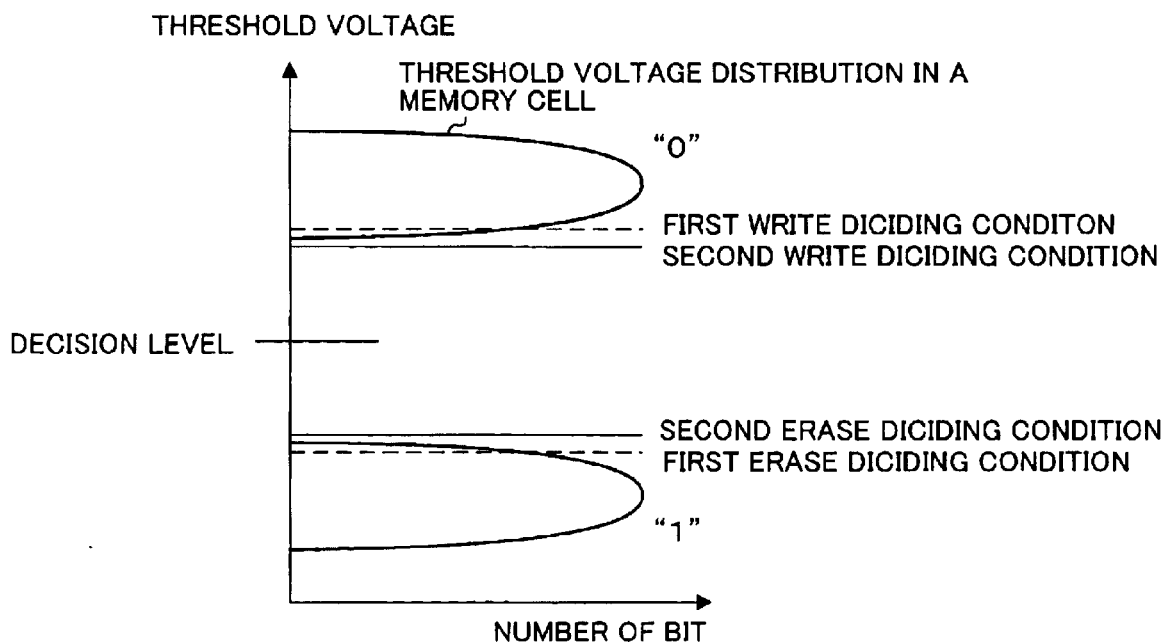
FIG. 10 is a view (#2) showing the concept of verification in the first embodiment.

In the actual memory, as shown in a conceptual view of FIG. 10, two types of deciding conditions are used in the write verification and the erase verification respectively. That is, the pass/fail are decide by first and second write deciding conditions at the time of write verification, and also the pass/fail are decide by first and second erase deciding conditions at the time of erase verification.

(Write Verification)

Figure 11:
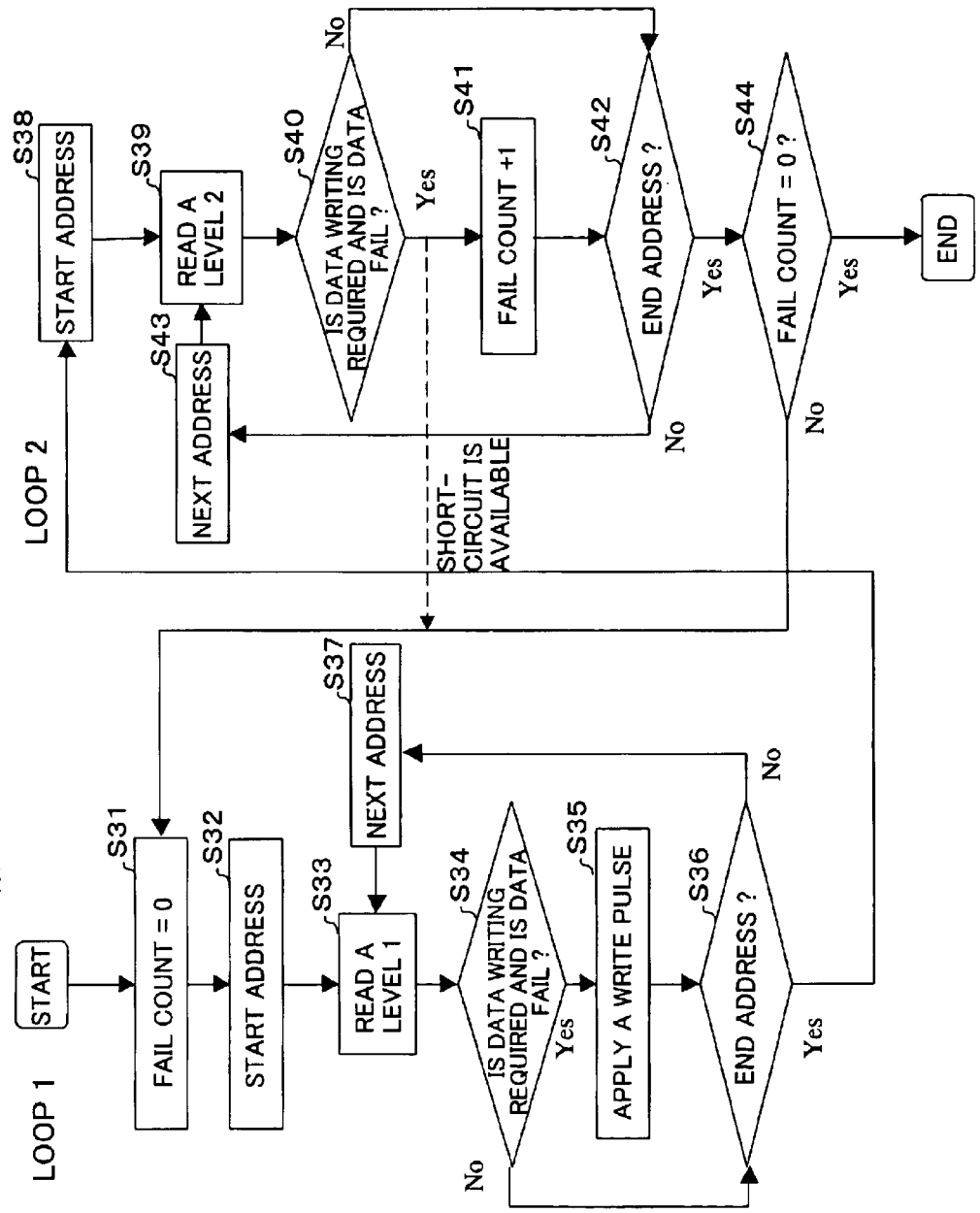
FIG. 11 is a flowchart showing a write verifying operation in the nonvolatile semiconductor memory according to the first embodiment.

FIG. 11 is a flowchart showing a write verifying operation in the nonvolatile semiconductor memory according to the first embodiment. In the write verification, the reading is executed prior to the writing operation to verify whether or not the writing is executed sufficiently. If the memory cell is the memory cell of which the data writing is required and the read data is fail, the writing operation is applied to the memory cell.

First, in step S31, the fail count is initialized (fail count= 0). Then, in step S32, the start address is set in the address counter. Then, in step S33, the data is read from the memory cell that has the start address. At this time, the data is read by setting an applied voltage Vwr to the word line to 5.2 V and setting an applied voltage Vbr to the bit line on the drain side to 1.4 V (first write deciding conditions).

Then, the process goes to step S34 to decide whether or not the memory cell is the memory cell of which the data writing is required. If the memory cell is the memory cell of which the data writing is required, it is decided whether or not the read data is fail. If the memory cell is the memory cell of which the data writing is required and the read data is fail (Yes) (if an output of the sense amplifier 45 is "1"), the process goes to step S35. In contrast, if the memory cell is not the memory cell of which the data writing is required or the read data is pass (No) (if the output of the sense amplifier 45 is "0"), the process goes to step S36.

In step S35, a write pulse is applied to the memory cell having the concerned address. Then, the process goes to step S36.

In step S36, it is decided whether or not the address being set in the address counter is the end address. If the address is not the end address, the process goes to step S37 wherein the next address is set in the address counter. Then, the process goes back to step S33 wherein the data is read from the memory cell that has the set address.

In this manner, the data is read sequentially from the memory cell having the start address through the memory cell having the end address. Then, an amount of charge stored in the memory cell, which is decided as the memory cell of which the data writing is required and also the data read from which is decided as the fail, is changed by applying a write pulse to the memory cell.

Then, the process goes from step S36 to step S38 to set the start address once again. Then, the process goes to step S39 to read the data from the memory cell that has the set address. At this time, the applied voltage Vwr to the word line is set to 5.0 V and the applied voltage Vbr to the bit line on the drain side is set to 1.4 V (second write deciding conditions).

Then, the process goes to step S40 to decide whether or not the memory cell is the memory cell of which the data writing is required. Then, if it is decided that the memory cell is the memory cell of which the data writing is required, it is decided whether or not the read data is fail. If the memory cell is the memory cell of which the data writing is required and the read data is fail (Yes) (if the output of the sense amplifier 45 is "1"), the process goes to step S41. In contrast, if the memory cell is not the memory cell of which the data writing is required or the read data is pass (No) (if the output of the sense amplifier 45 is "0"), the process goes to step S42.

In step S41, the number of fail count is incremented by 1. Then, the process goes to step S42.

In step S42, it is decided whether or not the address being set in the address counter is the end address. If the address is not the end address, the process goes to step S43 wherein the next address is set in the address counter. Then, the process goes back to step S39 wherein the data is read from the memory cell that has the set address.

In this manner, the data is read sequentially from the memory cell having the start address through the memory cell having the end address to decide whether or not the data writing is required and the data is fail. Then, if it is decided that the data is fail, the number of fail count is incremented.

Then, the process goes to step S44 from step S42 to decide whether or not the number of fail count is 0. If the number of fail count is not 0, the process goes back to step S31 and the above processes are repeated. If the number of fail count is 0, the write verification is ended.

In this fashion, in the present embodiment, the processes from step S31 to step S37 to decide whether or not the read data is fail under the first write deciding conditions and then apply the write pulse if the read data is fail (referred to as a "loop 1" hereinafter) are executed, and also the processes from step S38 to step S44 to decide whether or not the read data is fail under the second write deciding conditions and then increment the number of fail count if the read data is fail (referred to as a "loop 2" hereinafter) are executed.

It may be considered that the reference current and the cell current are changed on a time-dependent basis by the influence of the noise, etc. However, in the first embodiment, in the loop 1, it is decided under the deciding conditions that are more severe than the write deciding conditions in the loop 2 whether or not the read data is fail. That is, the voltage applied to the word line is set to 5.2 V in the loop 1 whereas the voltage applied to the word line is set to 5.0 V in the loop 2. Hence, it is assumed that an amount of charge stored in the memory cell is equal to each other, the current that flows through the memory cell (cell current) in the loop 2 is reduced smaller than that in the loop 1. As a result, even the memory cell that is contained in the dead band in the loop 1 is decided surely as the pass in the loop 2.

In this way, in the present embodiment, the pass/fail decisions can be executed more precisely at the time of write verification. Thus, the reliability of data can be improved and also a time required for the write verification can be reduced.

In this case, in the present embodiment, as shown by a broken-line arrow in FIG. 11, the process may go to step S31 if it is decided in step S40 that the data is fail.

(Erase Verification)

Figure 12:
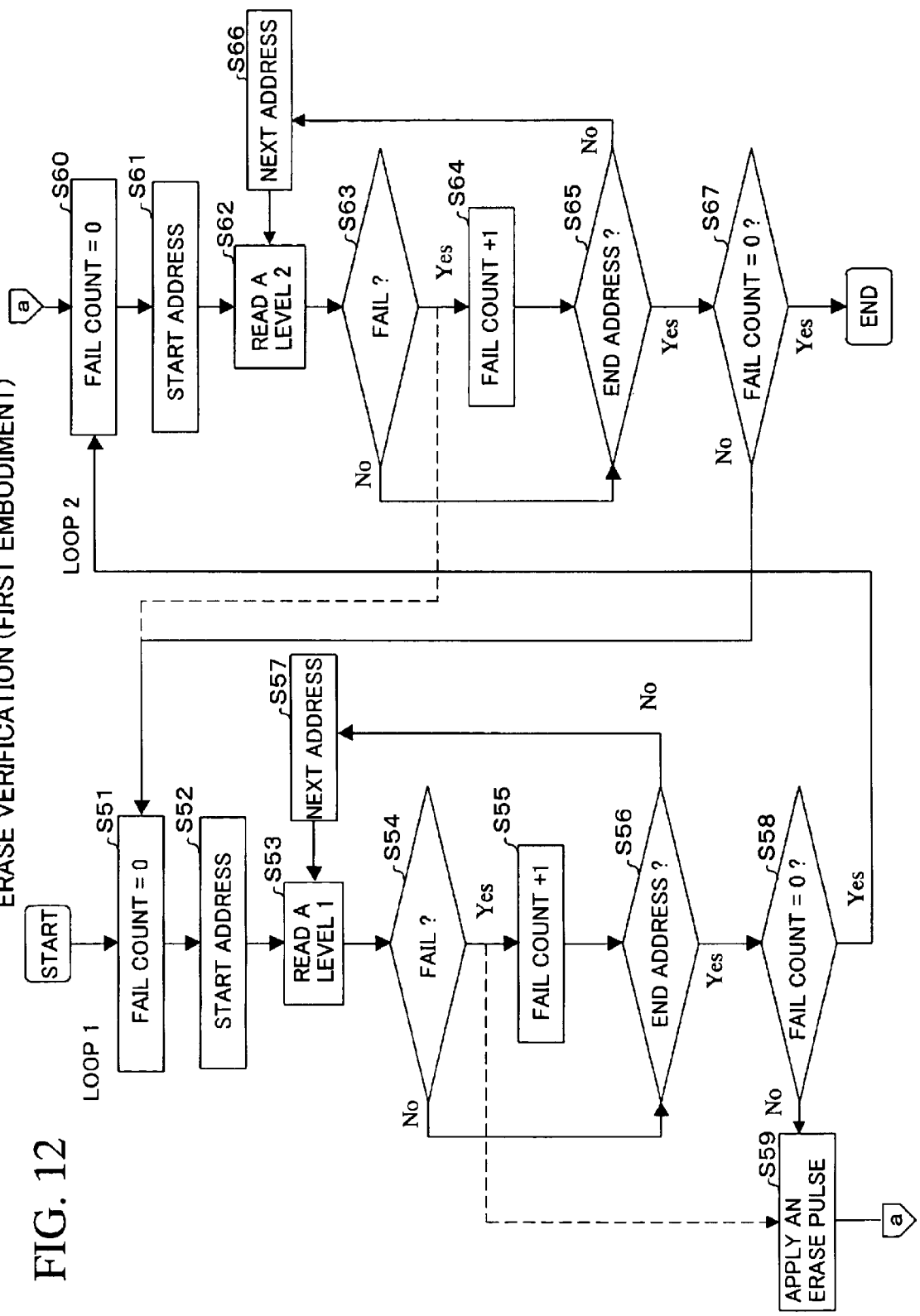
FIG. 12 is a flowchart showing an erase verifying operation in the nonvolatile semiconductor memory according to the first embodiment.

FIG. 12 is a flowchart showing an erase verifying operation in the nonvolatile semiconductor memory according to the first embodiment. In the erase verification, the reading operation is applied sequentially to all the memory cells in the block. Then, if at least one memory cell that is decides as fail is detected, the collective erasing operation is applied to the memory cells in the overall block.

First, in step S51, the fail count is initialized (fail count= 0). Then, in step S52, the start address is set in the address counter. Then, in step S53, the data is read from the memory cell that has the start address. At this time, the data reading is executed by setting the voltage Vwr applied to the word line to 2.3 V and setting the voltage Vbr applied to the bit line on the drain side to 1.4 V (first erase deciding conditions).

Then, the process goes to step S54 wherein it is decided whether or not the read data is fail. If the read data is fail (Yes) (if the output of the sense amplifier 45 is "1"), the process goes to step S55. In contrast, if the read data is pass (No) (if the output of the sense amplifier 45 is "0"), the process goes to step S56.

In step S55, the number of fail count is incremented by 1. Then, the process goes to step S56.

In step S56, it is decided whether or not the address being set in the address counter is the end address. If the address is not the end address, the process goes to step S57 wherein the next address is set in the address counter. Then, the process goes back to step S53 wherein the data is read from the memory cell that has the set address.

In this manner, the data is read sequentially from the memory cell having the start address through the memory cell having the end address to decide whether or not the data is fail. Then, the number of fail count is incremented every time when the fail is detected.

Then, the process goes from step S56 to step 58 wherein it is decided whether or not the number of fail count is 0. If the number of fail count is 0, the process goes from step S58 to step S60. In step S58, if the number of fail count is not 0, the process goes from step S59 wherein an erase pulse is applied collectively to the memory cells having the start address through the end address. Then, the process goes from step S60.

In step S60, the number of fail count is initialized once again (fail count=0). Then, the start address is set in step S61, and the data is read from the memory cell having the start address in step S62. At this time, the voltage Vwr applied to the word line is set to 2.5 V and the voltage Vbr applied to the bit line on the drain side is set to 1.4 V (second erase deciding conditions).

Then, the process goes to step S63 to decide whether or not the read data is fail. Then, if it is decided that the read data is fail (Yes) (if the output of the sense amplifier 45 is "1"), the process goes to step S64. In contrast, if the read data is pass (No) (if the output of the sense amplifier 45 is "0"), the process goes to step S65.

In step S64, the number of fail count is incremented by 1. Then, the process goes to step S65.

In step S65, it is decided whether or not the address being set in the address counter is the end address. If the address is not the end address, the process goes to step S66 wherein the next address is set in the address counter. Then, the process goes back to step S62 wherein the data is read from the memory cell that has the set address.

In this manner, the data is read sequentially from the memory cell having the start address through the memory cell having the end address to decide whether or not the data is fail. Then, the number of fail count is incremented every time when the fail is detected.

Then, the process goes from step S65 to step S67 to decide whether or not the number of fail count is 0. If the number of fail count is not 0, the process goes back to step S51 and the above processes are repeated. In step S65, if the number of fail count is 0, the erase verification is ended.

In this fashion, in the present embodiment, the processes from step S51 to step S58 to decide whether or not the data read from the memory cell is fail under the first erase deciding conditions and then apply the erase pulse if the read data is fail (referred to as a "loop 1" hereinafter) are executed, and also the processes from step S60 to step S67 to decide whether or not the data read from the memory cell is fail under the second erase deciding conditions and then increment the number of fail count if the read data is fail (referred to as a "loop 2" hereinafter) are executed.

It may be considered that the reference current and the cell current are changed on a time-dependent basis by the influence of the noise, etc. However, in the present embodiment, in the loop 1, it is decided under the deciding conditions that are more severe than the erase deciding conditions in the loop 2 whether or not the read data is fail. That is, the voltage applied to the word line is set to 2.3 V in the loop 1 whereas the voltage applied to the word line is set to 2.5 V in the loop 2. Hence, it is assumed that an amount of charge stored in the memory cell is equal to each other, the current that flows through the memory cell (cell current) in the loop 2 is increased larger than that in the loop 1. As a result, even the memory cell that is contained in the dead band in the loop 1 is decided surely as the pass in the loop 2.

In this way, in the present embodiment, the pass/fail decisions can be executed more precisely at the time of erase verification. Thus, the reliability of data can be improved and also a time required for the erase verification can be reduced.

In this case, as shown by a broken-line arrow in FIG. 12, in step S54, if it is decided that the read data is fail, the process may go to step S59. Also, in step S63, if it is decided that the read data is fail, the process may go to step S51.

In the above write verification and the above erase verification, if the reference current is set to 10 $\mu$A and the threshold voltage is defined as the voltage of the word line (WL voltage) when the cell current reaches 10 $\mu$A, the threshold voltage of the memory cell into which the data is written is 5 V or more and the threshold voltage of the memory cell from which the data is erased is 2.5 V or less. Thus, a difference (window) of the threshold voltages obtained when the data is "0" and the data is "1" becomes 2.5 V.

Accordingly, in the data reading operation, if the current Icore that flows through the memory cell is compared in magnitude with the reference current Iref by setting the voltage Vwr applied to the word line to 4.0 V and setting the voltage Vbr applied to the bit line on the drain side to 1.4 V, for example, the data "0" or the data "1" can be read precisely.

(Second Embodiment)

Figure 13:
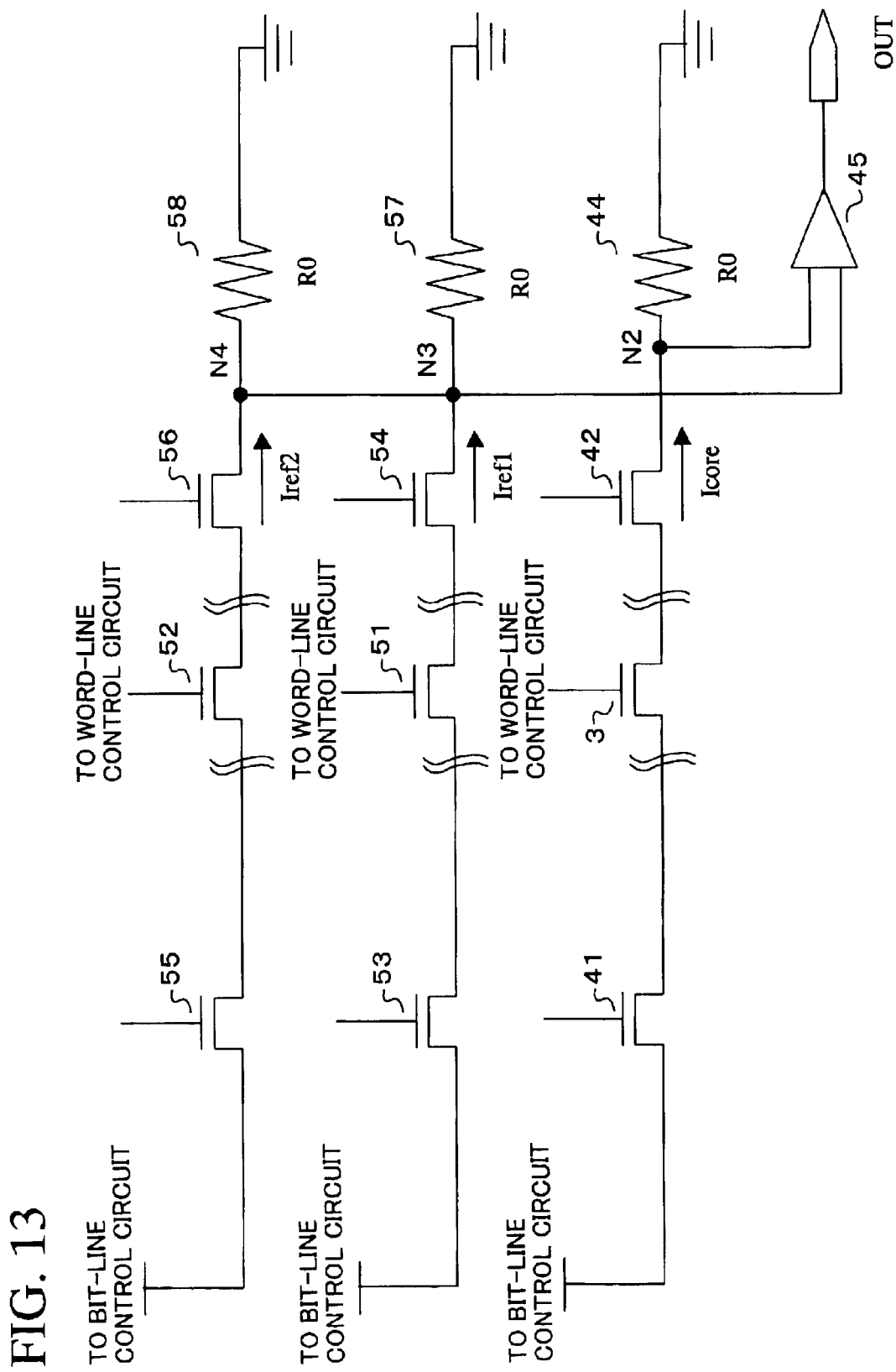
FIG. 13 is a circuit diagram showing a configuration of a pass/fail decision circuit of a nonvolatile semiconductor memory according to a second embodiment of the present invention.

FIG. 13 is a circuit diagram showing a configuration of a pass/fail decision circuit of a nonvolatile semiconductor memory according to a second embodiment of the present invention. In this case, a different point of the nonvolatile semiconductor memory according to the second embodiment from the first embodiment resides in a difference in configuration of the pass/fail decision circuit. Since other configurations are similar to those in the first embodiment, explanations of redundant portions will be omitted herein. Also, in FIG. 13, same symbols are affixed to the same parts as those in FIG. 8.

In the second embodiment, one data reading reference cell, two write verifying reference cells, and two erase verifying reference cells are provided in addition to the memory cell 3. These reference cells have basically the same structure as the memory cell 3. However, a threshold voltage of the data reading reference cell is set to 4.0 V, a threshold voltage of a first write verifying reference cell is set to 5.2 V, a threshold voltage of a second write verifying reference cell is set to 5.0 V, a threshold voltage of a first erase verifying reference cell is set to 2.3 V, and a threshold voltage of a second erase verifying reference cell is set to 2.5 V. In FIG. 13, merely the first write verifying reference cell 51 and the second write verifying reference cell 52 of these reference cells are depicted.

Selector gates (MOSFETs) 53, 54 are connected to the bit lines located on the source side and the drain side of the first write verifying reference cell 51 respectively. These selector gates 53, 54 are turned ON/OFF in response to the signal supplied from the control circuit. A resistor 57 whose resistance value is R0 is connected between the selector gate 54 and the ground. A connection point N3 between the resistor 57 and the selector gate 54 is connected to one input terminal of the sense amplifier 45.

Also, selector gates (MOSFETs) 55, 56 are connected to the bit lines located on the source side and the drain side of the second write verifying reference cell 52 respectively. These selector gates 55, 56 are turned ON/OFF in response to the signal supplied from the control circuit. A resistor 58 whose resistance value is R0 is connected between the selector gate 56 and the ground. A connection point N4 between the resistor 58 and the selector gate 56 is connected to one input terminal of the sense amplifier 45.

Similarly to this, the selector gates are connected to the bit lines located on the source side and the drain side of the first and second erase verifying reference cells respectively. The resistor whose resistance value is R0 is connected between one selector gate and the ground. Then, a connection point between the resistor and the selector gate is connected to one input terminal of the sense amplifier 45.

(Write Verification)

An operation executed at the time of write verification will be explained hereunder. In the present embodiment, the operation executed at the time of write verification will also be explained with reference to the flowchart in FIG. 11 hereunder.

First, in step S31, the fail count is initialized (fail count= 0). Then, in step S32, the start address is set in the address counter. Then, in step S33, the data is read from the memory cell that has the start address.

At this time, the read voltage Vwr=4.0 V is supplied simultaneously to the word line that is connected to gates of the memory cell 3 and the first write verifying reference cell 51, and the voltage Vbr=1.4 V is supplied simultaneously to the bit lines on the drain side (first write deciding conditions). Also, the current is not flown through the second write verifying reference cell 52, the data reading reference cell, and the first and second erase verifying reference cells by turning OFF the selector gates that are connected to these cells.

Then, the process goes to step S34 to decide whether or not the memory cell is the memory cell of which the data writing is required. If the memory cell is the memory cell of which the data writing is required, it is decided whether or not the read data is fail. If the memory cell is the memory cell of which the data writing is required and the read data is fail (Yes), the process goes to step S35. In contrast, if the memory cell is not the memory cell of which the data writing is required or the read data is pass (No), the process goes to step S36.

If the memory cell is the memory cell of which the data writing is required, the data is decided as fail when the threshold voltage is lower than the threshold voltage (5.2 V) of the reference cell 51.

In step S35, a write pulse is applied to the memory cell having the concerned address. Then, the process goes to step S36.

In step S36, it is decided whether or not the address being set in the address counter is the end address. If the address is not the end address, the process goes to step S37 wherein the next address is set in the address counter. Then, the process goes back to step S33 wherein the data is read from the memory cell that has the set address.

In this manner, the data is read sequentially from the memory cell having the start address through the memory cell having the end address. Then, an amount of charge stored in the memory cell, which is decided as the memory cell of which the data writing is required and also the data read from which is decided as the fail, is changed by applying a write pulse to the memory cell.

Then, the process goes from step S36 to step S38 to set the start address once again. Then, the process goes to step S39 to read the data from the memory cell that has the set address.

At this time, the read voltage Vwr=4.0 V is supplied simultaneously to the word line that is connected to the gates of the memory cell 3 and the second write verifying reference cell 52, and the voltage Vbr=1.4 V is supplied simultaneously to the bit lines on the drain side (second write deciding conditions). Also, the current is not flown through the first write verifying reference cell 51, the data reading reference cell, and the first and second erase verifying reference cells by turning OFF the selector gates that are connected to these cells.

Then, the process goes to step S40 to decide whether or not the memory cell is the memory cell of which the data writing is required. Then, if it is decided that the memory cell is the memory cell of which the data writing is required, it is decided whether or not the read data is fail. If the memory cell is the memory cell of which the data writing is required and the read data is fail (Yes) (if the output of the sense amplifier 45 is "1"), the process goes to step S41. In contrast, if the memory cell is not the memory cell of which the data writing is required or the read data is pass (No) (if the output of the sense amplifier 45 is "0"), the process goes to step S42.

If the memory cell is the memory cell of which the data writing is required, the data is decided as pass when the threshold voltage is higher than the threshold voltage (5.0 V) of the reference cell 52.

In step S41, the number of fail count is incremented by 1. Then, the process goes to step S42.

In step S42, it is decided whether or not the address being set in the address counter is the end address. If the address is not the end address, the process goes to step S43 wherein the next address is set in the address counter. Then, the process goes back to step S39 wherein the data is read from the memory cell that has the set address.

In this manner, the data is read sequentially from the memory cell having the start address through the memory cell having the end address to decide whether or not the data writing is required and the data is fail. Then, if it is decided that the data is fail, the number of fail count is incremented.

Then, the process goes to step S44 from step S42 to decide whether or not the number of fail count is 0. If the number of fail count is not 0, the process goes back to step S31, and then the above processes are repeated. If the number of fail count is 0, the write verification is ended.

In this fashion, in the present embodiment, in the loop 1, it is decided by comparing the current Icore flowing through the memory cell 3 with the current Iref1 flowing through the first write verifying reference cell 51 whose threshold voltage is high whether or not the data is fail, and then the write pulse is applied to the memory cell if the data is decided as fail. In contrast, in the loop 2, it is decided by comparing the current Icore flowing through the memory cell 3 with the current Iref2 flowing through the second write verifying reference cell 52 whose threshold voltage is low whether or not the data is fail. As a result, even the memory cell that is contained in the dead band in the loop 1 is decided surely as the pass in the loop 2.

(Erase Verification)

An operation executed at the time of erase verification will be explained hereunder. In the present embodiment, the operation executed at the time of erase verification will also be explained with reference to the flowchart in FIG. 12 hereunder.

First, in step S51, the fail count is initialized (fail count=0). Then, in step S52, the start address is set in the address counter. Then, in step S53, the data is read from the memory cell that has the start address. At this time, the read voltage Vwr=4.0 V is supplied simultaneously to the word line that is connected to the gates of the memory cell 3 and the first erase verifying reference cell, and the voltage Vbr=1.4 V is supplied simultaneously to the bit lines on the drain side (first erase deciding conditions). Also, the current is not flown through the second erase verifying reference cell, and the first and second write verifying reference cells by turning OFF the selector gates that are connected to these cells.

Then, the process goes to step S54 wherein it is decided whether or not the read data is fail. In case the threshold voltage of the memory cell is higher than the threshold voltage (2.3 V) of the first erase verifying reference cell, it is decided that the read data is fail. If the read data is fail (Yes), the process goes to step S55. In contrast, if the read data is pass (No), the process goes to step S56.

In step S55, the number of fail count is incremented by 1. Then, the process goes to step S56.

In step S56, it is decided whether or not the address being set in the address counter is the end address. If the address is not the end address, the process goes to step S57 wherein the next address is set in the address counter. Then, the process goes back to step S53 wherein the data is read from the memory cell that has the set address.

Then, the process goes from step S56 to step 58 wherein it is decided whether or not the number of fail count is 0. If the number of fail count is 0, the process goes to step S60. In step S58, if the number of fail count is not 0, the process goes to step S59. Then, an erase pulse is applied collectively to the memory cell having the start address through the memory cell having the end address. Then, the process goes to step S60.

In step S60, the number of fail count is initialized once again (fail count=0). Then, the start address is set in step S61, and the data is read from the memory cell having the start address in step S62.

At this time, the read voltage Vwr=4.0 V is supplied simultaneously to the word line that is connected to the gates of the memory cell 3 and the second erase verifying reference cell, and the voltage Vbr=1.4 V is supplied simultaneously to the bit lines on the drain side (second erase deciding conditions). Also, the current is not flown through the first erase verifying reference cell, the data reading reference cell, and the first and second data write verifying reference cells by turning OFF the selector gates that are connected to these cells.

Then, the process goes to step S63 to decide whether or not the read data is fail. In case the threshold voltage of the memory cell is lower than the threshold voltage (2.5 V) of the second erase verifying reference cell, it is decided that the read data is pass. Then, if it is decided that the read data is fail (Yes), the process goes to step S64. In contrast, if the read data is pass (No), the process goes to step S65.

In step S64, the number of fail count is incremented by 1. Then, the process goes to step S65.

In step S65, it is decided whether or not the address being set in the address counter is the end address. If the address is not the end address, the process goes to step S66 wherein the next address is set in the address counter. Then, the process goes back to step S62 wherein the data is read from the memory cell that has the set address.

Then, the process goes from step S65 to step S67 to decide whether or not the number of fail count is 0. If the number of fail count is not 0, the process goes back to step S51 and then the above processes are repeated. In step S65, if the number of fail count is 0, the erase verification is ended.

In this fashion, in the second embodiment, in the loop 1, the current flowing through the memory cell 3 is compared with the current flowing through the first erase verifying reference cell whose threshold voltage is low to decide whether or not the data is fail. Then, if it is decided that the data is fail, the erase pulse is applied to the memory cell. In contrast, in the loop 2, the current flowing through the memory cell 3 is compared with the current flowing through the second erase verifying reference cell whose threshold voltage is high to decide whether or not the data is fail. As a result, even the memory cell that is contained in the dead band in the loop 1 can be decided surely as the pass in the loop 2.

(Third Embodiment)

Figure 14:
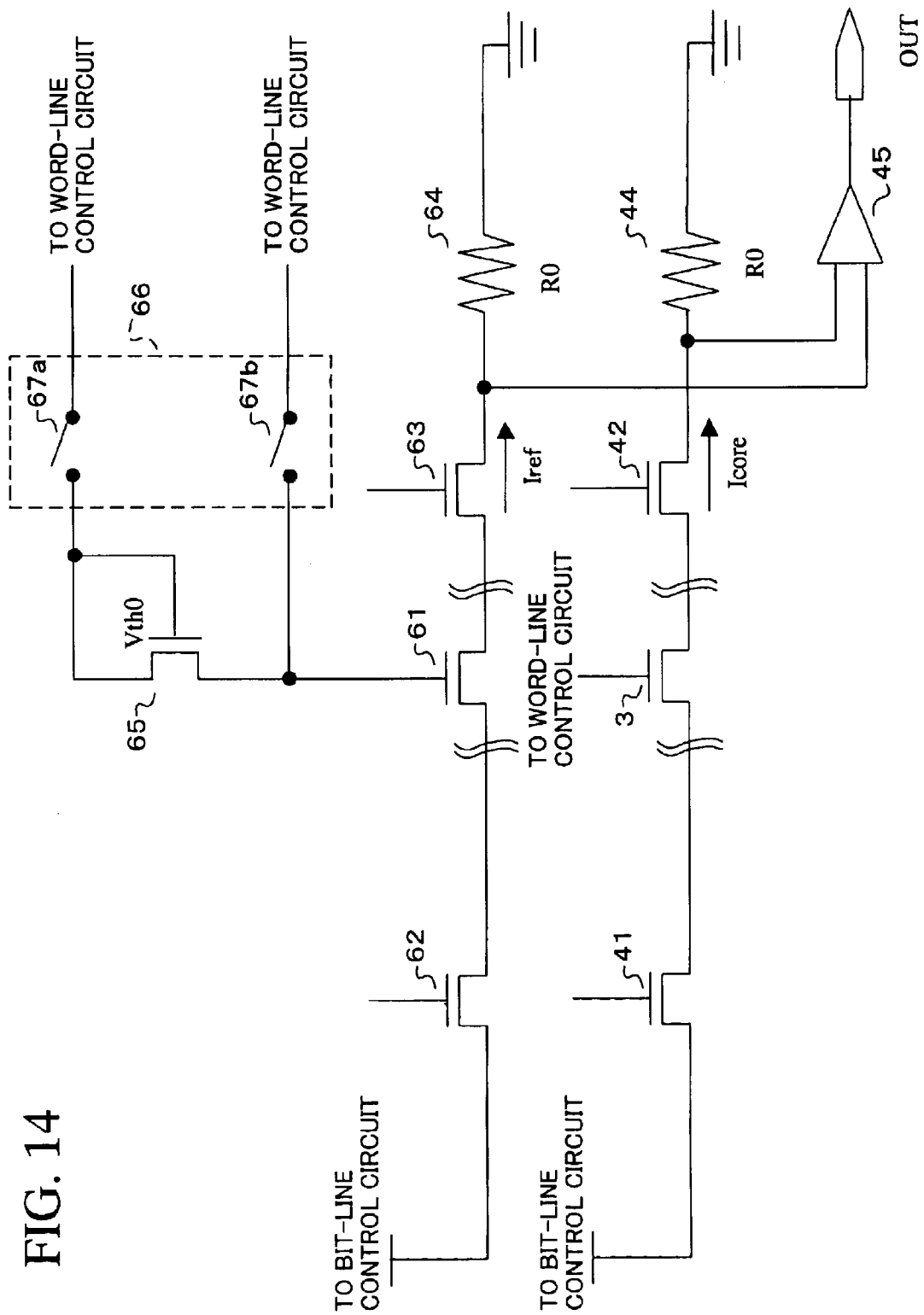
FIG. 14 is a circuit diagram showing a configuration of a pass/fail decision circuit of a nonvolatile semiconductor memory according to a third embodiment of the present invention.

FIG. 14 is a circuit diagram showing a configuration of a pass/fail decision circuit of a nonvolatile semiconductor memory according to a third embodiment of the present invention. In this case, a different point of the nonvolatile semiconductor memory according to the third embodiment from the first embodiment resides in a difference in configuration of the pass/fail decision circuit. Since other configurations are similar to those in the first embodiment, explanations of redundant portions will be omitted herein. Also, in FIG. 14, same symbols are affixed to the same parts as those in FIG. 8.

In the above second embodiment, two reference cells for the write verification and the erase verification are required respectively. For this reason, there is such a drawback that it becomes complicated to set the threshold voltage in respective reference cells. In the third embodiment, the pass/fail decision circuit is constructed by one write verifying reference cell and one erase verifying reference cell. The write verifying reference cell will be explained herein.

Selector gates (MOSFETs) 62, 63 are connected to the bit lines located on the source side and the drain side of a reference cell 61 respectively. These selector gates 62, 63 are turned ON/OFF in response to the signal supplied from the control circuit. A resistor 64 whose resistance value is R0 is connected between the selector gate 63 and the ground.

In the case of the write verifying reference cell, the threshold voltage is set to 5.0 V. In the case of the erase verifying reference cell, the threshold voltage is set to 2.3 V.

A level switching circuit 66 consists of two switches 67a, 67b. One switch 67a is connected between the word-line control circuit and a level control transistor 65, and the other switch 67b is connected between the word-line control circuit and a gate of the reference cell 61.

A drain and a gate of the level control transistor 65 is connected to the switch 67a, and a source thereof is connected to a gate of the reference cell 61.

A threshold voltage Vth0 of this level control transistor 65 is adjusted into 0.2 V. Also, a transistor having the same conductivity type as the memory cell 3 is used as the transistor 65. For example, the level control transistor 65 is also the p-type transistor if the memory cell 3 is the p-type transistor, and the level control transistor 65 is also the n-type transistor if the memory cell 3 is the n-type transistor. In this example, assume that the level control transistor 65 is composed of the n-type transistor.

In the nonvolatile semiconductor memory according to the third embodiment, the write verifying operation and the erase verifying operation are also executed in compliance with the flowcharts shown in FIG. 11 and FIG. 12. In this case, in the case of the write verification, in the loop 1, the pass/fail decisions are executed by turning the switch 67*a* ON and turning the switch 67*b* OFF. Also, in the loop 2, the pass/fail decisions are executed by turning the switch 67*a* OFF and turning the switch 67*b* ON.

In the loop 1, the voltage applied to the gate of the reference cell 61 is 3.8 V (4.0 V–0.2 V). In the loop 2, the voltage applied to the gate of the reference cell 61 is 4 V. That is, in the loop 1, the pass/fail decisions are executed under the conditions that are more severe than those in the loop 2. As a result, even the memory cell that is contained in the dead band in the loop 1 is decided surely as the pass in the loop 2.

In the case of the erase verification, in the loop 1, the pass/fail decisions are executed by turning the switch 67*a* OFF and turning the switch 67*b* ON. Also, in the loop 2, the pass/fail decisions are executed by turning the switch 67*a* ON and turning the switch 67*b* OFF.

In the loop 1, the voltage applied to the gate of the reference cell 61 is 4.0 V. In the loop 2, the voltage applied to the gate of the reference cell 61 is 3.8 V (4.0 V–0.2 V). That is, in the loop 1, the pass/fail decisions are executed under the conditions that are more severe than those in the loop 2. As a result, even the memory cell that is contained in the dead band in the loop 1 is decided surely as the pass in the loop 2.

In the present embodiment, in addition to the similar advantages to those in the second embodiment, such advantages can be achieved that only one write verifying reference cell and one erase verifying reference cell are required respectively and thus adjustment of the threshold voltage can be facilitated.

(Fourth Embodiment)

A nonvolatile semiconductor memory according to a fourth embodiment of the present invention will be explained hereunder. In the fourth embodiment, an example in which the present invention is applied to a multi-level memory is shown.

Figure 15:
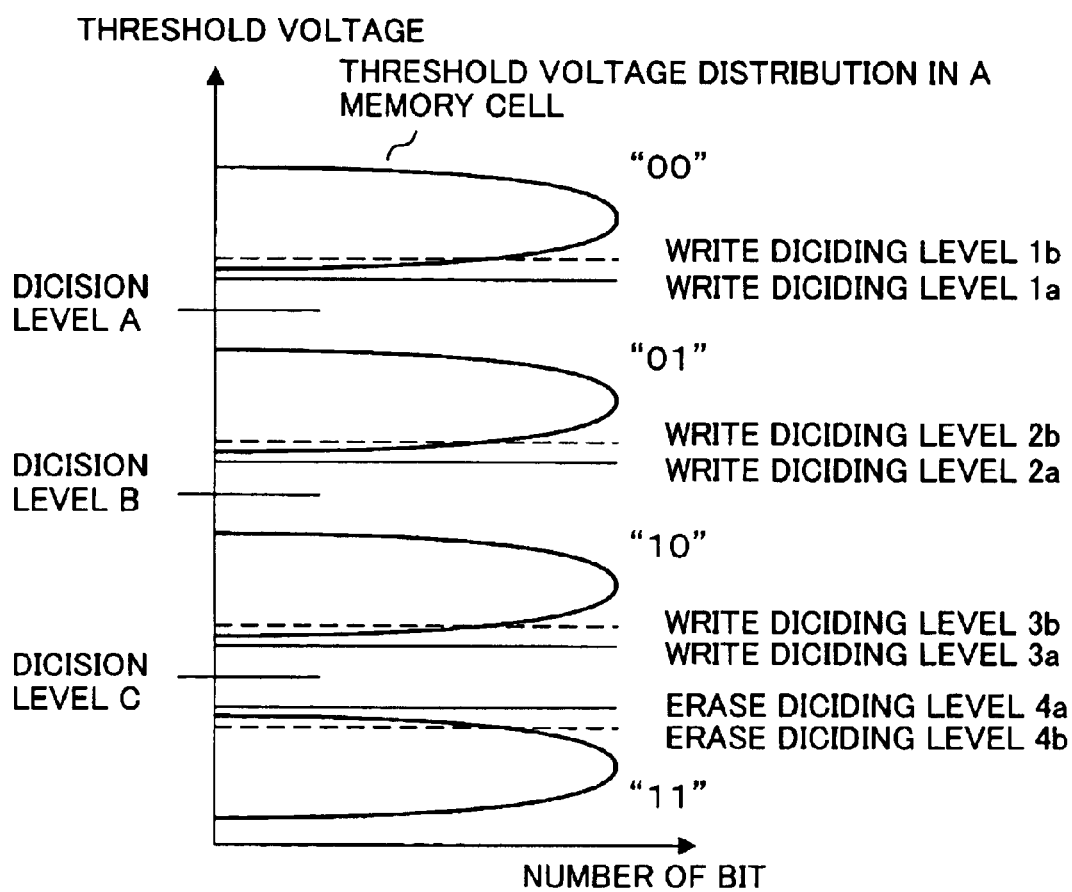
FIG. 15 is a conceptual view showing a distribution of threshold voltages in a multi-level memory and decision levels corresponding to respective values.

In the multi-level memory, the threshold voltages of the memory cell are set in response to the data. If two-bit data is to be stored in one memory cell, the data writing is executed at the voltages that respond to four data "00", "01", "10", and "11", as shown in FIG. 15. In the fourth embodiment, it is assumed that the threshold voltage is set to 6 V when the data "00" is to be written, the threshold voltage is set to 4 V when the data "01" is to be written, and the threshold voltage is set to 2 V when the data "10" is to be written. Also, the erase level is set to 1 V, and the data of the memory cell whose threshold voltage is 1 V or less is assumed as "11".

Three decision levels (decision levels A, B, C) are used to decide the data stored in the memory cell. Here, the decision level A is set to 5 V, the decision level B is set to 3 V, and the decision level C is set to 1.5 V.

If all the compared results between the cell voltage, which is read from the memory cell, and the decision levels A, B, C are "0", the data stored in the memory cell is decided as "00". If the compared result between the cell voltage, which is read from the memory cell, and the decision level A is "1" and both the compared results between the cell voltage and the decision levels B, C are "0", the data stored in the memory cell is decided as "01". If both the compared results between the cell voltage, which is read from the memory cell, and the decision levels A, B are "1", and the compared result between the cell voltage and the decision level C is "0", the data stored in the memory cell is decided as "10". If all the compared results between the cell voltage, which is read from the memory cell, and the decision levels A, B, C are "1", the data stored in the memory cell is decided as "11".

As described above, in the data writing operation and the data reading operation, the dead band appears due to the influence of the power supply noise, etc. Therefore, in the fourth embodiment, as shown in FIG. 15, a write deciding level 1*b* that is set slightly severely rather than a write deciding level 1*a* for the data "00", a write deciding level 2*b* that is set slightly severely rather than a write deciding level 2*a* for the data "01", a write deciding level 3*b* that is set slightly severely rather than a write deciding level 3*a* for the data "10", and an erase deciding level 4*b* that is set slightly severely rather than an erase deciding level 4*a* are employed. The comparison between the write decision level or the erase decision level and the cell voltage is executed by using the pass/fail decision circuit explained in the third embodiment.

Figure 16A:
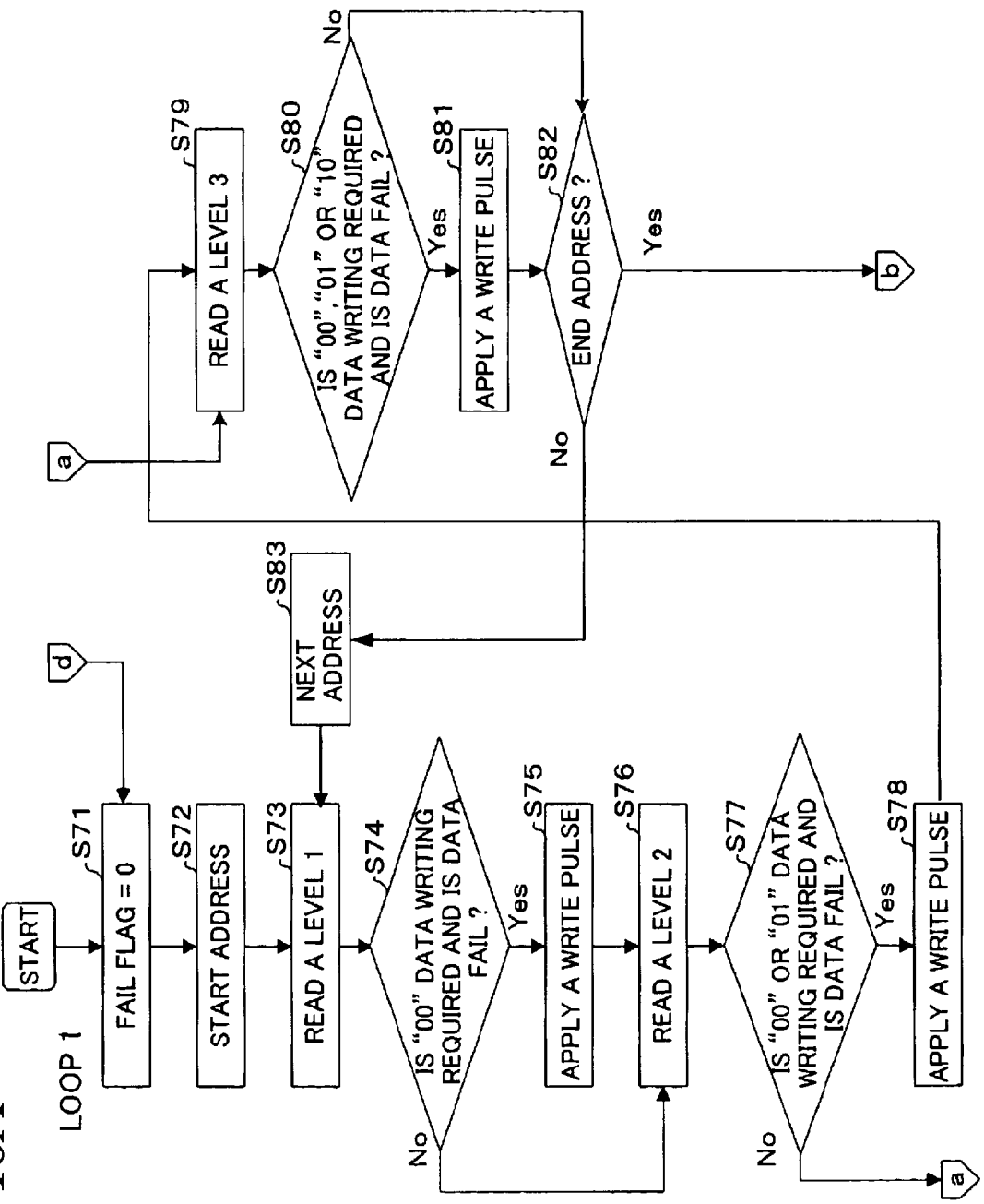
FIGS. 16A and 16B are a flowchart showing a write verifying operation in a nonvolatile semiconductor memory according to a fourth embodiment of the present invention.
Figure 16B:
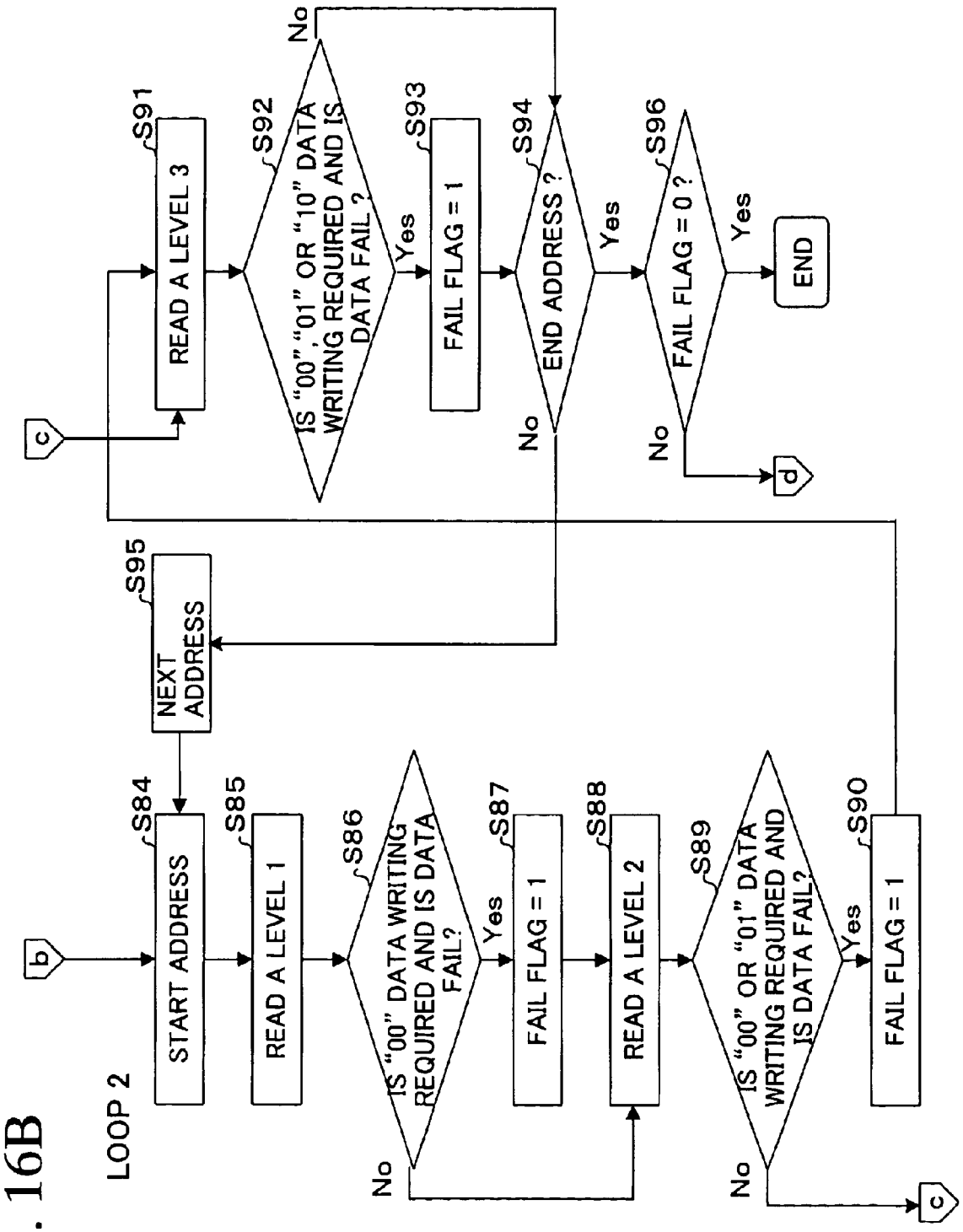

FIGS. 16A and 16B are a flowchart showing the write verifying operation in the nonvolatile semiconductor memory according to the fourth embodiment.

First, in step S71, a fail flag is initialized (fail flag=0). Like the first to third embodiments, the fail counter may be employed in place of the fail flag.

Then, in step S72, the start address is set in the address counter. In step S73, the data is read from the memory cell that has the start address. Then, the process goes to step S74 wherein it is decided whether or not the memory cell is the memory cell of which the writing of the data "00" is required. If the memory cell is the memory cell of which the writing of the data is required, it is decided whether or not the read data is fail. The data reading and the pass/fail decision are executed under the conditions that correspond to the write decision level 1*b* shown in FIG. 15.

If the memory cell is the memory cell of which the writing of the data "00" is required and the read data is fail (Yes), the process goes to step S75. In contrast, if the memory cell is the memory cell of which the writing of the data "00" is not required or the read data is pass (No), the process goes to step S76.

In step S75, the write pulse is applied to the memory cell having the concerned address. Then, the process goes to step S76.

In step S76, the data is read from the memory cell that is set in the address counter. Then, the process goes to step S77 wherein it is decided whether or not the memory cell is the memory cell of which the writing of the data "00" or "01" is required. If the memory cell is the memory cell of which the writing of the data is required, it is decided whether or not the read data is fail. The data reading and the pass/fail decision are executed under the conditions that correspond to the write decision level 2*b* shown in FIG. 15.

If the memory cell is the memory cell of which the writing of the data "00" or "01" is required and the read data is fail (Yes), the process goes to step S78. In contrast, if the memory cell is the memory cell of which the writing of the data "00" or "01" is not required or the read data is pass (No), the process goes to step S79.

In step S78, the write pulse is applied to the memory cell having the concerned address. Then, the process goes to step S79.

In step S79, the data is read from the memory cell that is set in the address counter. Then, the process goes to step S80 wherein it is decided whether or not the memory cell is the memory cell of which the writing of the data "00", "01" or "10" is required. If the memory cell is the memory cell of which the writing of the data is required, it is decided whether or not the read data is fail. The data reading and the pass/fail decision are executed under the conditions that correspond to the write decision level 3b shown in FIG. 15.

If the memory cell is the memory cell of which the writing of the data "00", "01" or "10" is required and the read data is fail (Yes), the process goes to step S81. In contrast, if the memory cell is the memory cell of which the writing of the data "00", "01" or "10" is not required or the read data is pass (No), the process goes to step S82.

In step S81, the write pulse is applied to the memory cell having the concerned address. Then, the process goes to step S82.

In step S82, it is decided whether or not the address being set in the address counter is the end address. If the address is not the end address, the process goes to step S83 wherein the next address is set in the address counter. Then, the process goes back to step S73 wherein the data is read from the memory cell that has the set address.

In this manner, in the processes from step S71 to step S82 (referred to as a "loop 1" hereinafter), the data is read sequentially from the memory cell having the start address through the memory cell having the end address. Then, an amount of charge stored in the memory cell is changed by applying the write pulse to the memory cell to which the predetermined data has not been written.

Then, the process goes from step S82 to step S84 to set the start address in the address counter.

Then, the process goes to step S85 to read the data from the memory cell that has the set address. Then, the process goes to step S86 wherein it is decided whether or not the memory cell is the memory cell of which the writing of the data "00" is required. If the memory cell is the memory cell of which the writing of the data is required, it is decided whether or not the read data is fail. The data reading and the pass/fail decision are executed under the conditions that correspond to the write decision level 1a shown in FIG. 15.

If the memory cell is the memory cell of which the writing of the data "00" is required and the read data is fail (Yes), the process goes to step S87. In contrast, if the memory cell is the memory cell of which the writing of the data "00" is not required or the read data is pass (No), the process goes to step S88.

In step S87, the fail flag is set to "1". Then, the process goes to step S88.

In step S88, the data is read from the memory cell that is set in the address counter. Then, the process goes to step S89 wherein it is decided whether or not the memory cell is the memory cell of which the writing of the data "00" or "01" is required. If the memory cell is the memory cell of which the writing of the data is required, it is decided whether or not the read data is fail. The data reading and the pass/fail decision are executed under the conditions that correspond to the write decision level 2a shown in FIG. 15.

If the memory cell is the memory cell of which the writing of the data "00" or "01" is required and the read data is fail (Yes), the process goes to step S90. In contrast, if the memory cell is the memory cell of which the writing of the data "00" or "01" is not required or the read data is pass (No), the process goes to step S91.

In step S90, the fail flag is set to "1". Then, the process goes to step S91.

In step S91, the data is read from the memory cell that is set in the address counter. Then, the process goes to step S92 wherein it is decided whether or not the memory cell is the memory cell of which the writing of the data "00", "01", or "10" is required. If the memory cell is the memory cell of which the writing of the data is required, it is decided whether or not the read data is fail. The data reading and the pass/fail decision are executed under the conditions that correspond to the write decision level 3a shown in FIG. 15.

If the memory cell is the memory cell of which the writing of the data "00", "01"or "10" is required and the read data is fail (Yes), the process goes to step S93. In contrast, if the memory cell is the memory cell of which the writing of the data "00", "01" or "10" is not required or the read data is pass (No), the process goes to step S94.

In step S93, the fail flag is set to "1". Then, the process goes to step S94.

In step S94, it is decided whether or not the address being set in the address counter is the end address. If the address is not the end address, the process goes to step S95 wherein the next address is set in the address counter. Then, the process goes back to step S84 wherein the data is read from the memory cell that has the set address.

In this manner, in the processes from step S84 to step S94 (referred to as a "loop 2" hereinafter), the data is read sequentially from the memory cell having the start address through the memory cell having the end address. Then, if the memory cell to which the predetermined data has not been written is detected, the fail flag is set to "1".

Then, the process goes from step S94 to step S96 wherein it is decided whether or not the fail flag is "0". If the fail flag is "1", the process goes back to step S71 and then the above processes are repeated. In contrast, if the fail flag is "0", the write verification is ended.

In this way, in the present embodiment, in the loop 1, it is decided under the conditions that are more severe than the write deciding conditions in the loop 2 whether or not the read data is fail. Therefore, even the memory cell that is contained in the dead band in the loop 1 is decided surely as the pass in the loop 2. As a result, the reliability of data can be improved and also a time required for the write verification can be reduced.

In this case, since the erase verifying operation of the nonvolatile semiconductor memory in the present embodiment is basically similar to that in the first embodiment, its explanation will be omitted herein.

Also, in the above first to fourth embodiments, the difference between the applied voltages in the first deciding conditions and the second deciding conditions is set to 0.2 V respectively. But actually the applied voltages in the first deciding conditions and the second deciding conditions must be appropriately set in response to fluctuation in the voltage due to the noise, etc.

(Other Embodiment 1)

In the above first to fourth embodiments, the case where the present invention is applied to the SONOS nonvolatile semiconductor memory is explained respectively. But the present invention can be applied to other single gate memories and the floating gate memory. Also, the present invention can be applied regardless of the condition that the circuit configuration of the semiconductor memory is a NOR type or a NAND type. In addition, the present invention can be applied regardless of the condition that the data is written by the channel hot electron or the FN (Fowler-Nordheim) tunneling as the data writing system.

Figure 17:
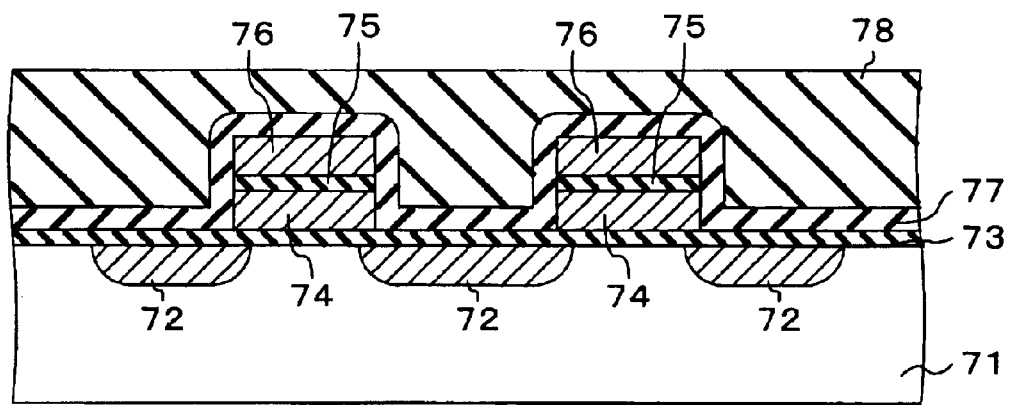
FIG. 17 is a sectional view showing an example of a floating gate memory (NOR gate type)

FIG. 17 is a sectional view showing an example of a floating gate memory (NOR gate type).

Impurity diffusion layers 72 serving as the source/drain of the memory cell are formed in a silicon substrate 71. A silicon oxide film (gate oxide film) 73 is formed on a surface of the silicon substrate 71.

A floating gate 74 is formed on the silicon oxide film 73 between a pair of impurity diffusion layers 72. An insulating film 75 is formed on this floating gate 74. A control gate 76 having a laminated structure that consists of a polysilicon layer and a tungsten silicide layer is formed on the insulating film 75.

The floating gate 74 and the control gate 76 are covered with an interlayer insulating film having a laminated structure that consists of a silicon oxide film 77 and a BPSG (Borophosphosilicate Glass) film 78.

Figure 18:
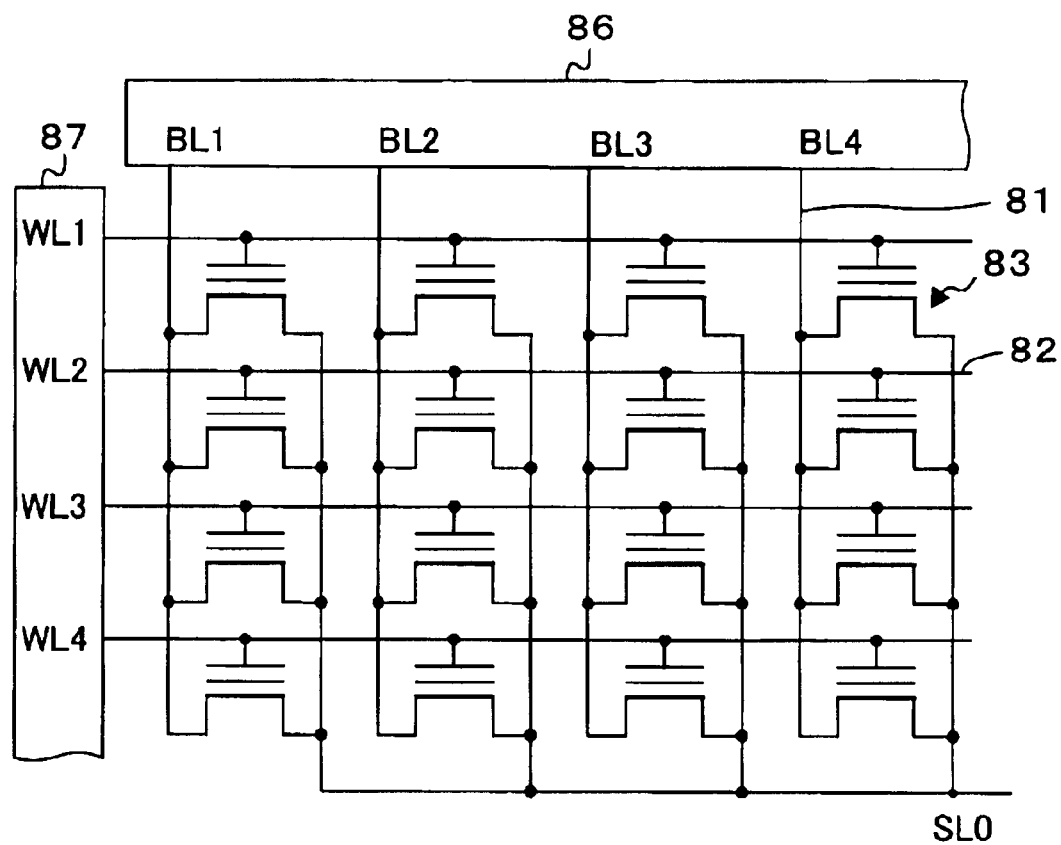
FIG. 18 is a block diagram showing a circuit configuration of a floating gate memory (flash memory)

FIG. 18 is a block diagram showing a circuit configuration of the floating gate memory (flash memory).

FETs 83 each constituting the memory cell are arranged in a matrix. The control gates of the memory cells, which are arranged in the row direction, are connected to common word lines (WL1, WL2, . . . ) 82. Also, the drains of the memory cells, which are arranged in the column direction, are connected to common bit lines (BL1, BL2, . . . ) 81. In addition, the sources of the memory cells (FETS) 3 in the same block are connected to a common source line SL0.

The bit lines BL1, BL2, . . . are connected to a sense amplifier portion 86, and the word lines WL1, WL2, . . . are connected to a word line driver 87. The sense amplifier portion 86 and the word line driver 87 are operated by a signal supplied from a control circuit (not shown) (see FIG. 7). The pass/fail deciding circuit shown in the first to third embodiments is formed in the sense amplifier portion 86.

In the floating gate memory constructed in this manner, if the write verification and the erase verification are executed according to the method shown in the first to fourth embodiments, not only the pass/fail decision can be executed precisely irrespective of the power supply noise and other noises but also a time required for the write verification and the erase verification can be reduced.

(Other Embodiment 2)

An operation method of the nonvolatile semiconductor memory of the present invention can also be applied to inspection steps after the manufacture of the nonvolatile semiconductor memory.

Figure 19:
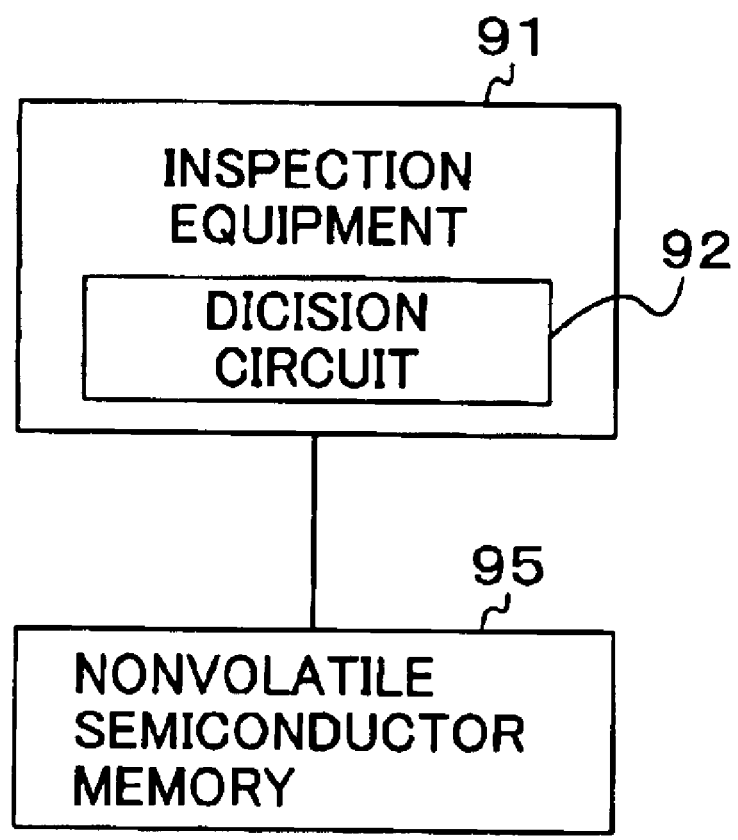
FIG. 19 is a view showing an outline of an inspection method of the nonvolatile semiconductor memory.

FIG. 19 is a view showing an outline of an inspection method of the nonvolatile semiconductor memory. A pass/fail decision circuit 92 shown in FIG. 8, FIG. 13, or FIG. 14 is provided to an inspection equipment 91. This inspection equipment 91 and a manufactured nonvolatile semiconductor memory 95 are connected electrically via an inspection probe, and then the data writing or the data erasing is executed in compliance with the flowcharts shown in FIG. 11, FIG. 12, or FIG. 16A and FIG. 16B. Then, it is decided based on the number of execution times of the loops 1, 2 or the number of fail decision whether or not the nonvolatile semiconductor memory is good or bad.

In this case, since the pass/fail decision is executed in the loop 1 under the conditions that are more severe than the loop 2, the loop is never repeated wastefully and also the quality of the nonvolatile semiconductor memory can be decided in a short time.

Also, the above operation method can be applied to the cycling test that inspects a lifetime of the nonvolatile semiconductor memory by repeating the data writing and the data erasing in the nonvolatile semiconductor memory.

What is claimed is:

1. A nonvolatile semiconductor memory comprising:
   a nonvolatile memory cell for storing a charge in response to data; and
   a memory cell driving portion for driving the memory cell;
   wherein the memory cell driving portion executes a first decision process of deciding pass/fail of the data that is read from the memory cell under a first deciding condition and then applying a signal to the memory cell that is decided as fail to change an amount of charge stored in the memory cell, and a second decision process of deciding the pass/fail of the data that is read from the memory cell under a second deciding condition that is relaxed rather than the first deciding condition.

2. A nonvolatile semiconductor memory according to claim 1, wherein the pass/fail is decided in the first decision process in a write verification by setting a current, which is smaller than a reference current employed in the second decision process, as the reference current, and the pass/fail is decided in the first decision process in an erase verification by setting a current, which is larger than a reference current employed in the second decision process, as the reference current.

3. A nonvolatile semiconductor memory according to claim 1, wherein the pass/fail is decided in the first decision process in a write verification by using a reference cell whose threshold value is higher than a reference cell employed in the second decision process, and the pass/fail is decided in the first decision process in an erase verification by using a reference cell whose threshold value is lower than a reference cell employed in the second decision process.

4. A nonvolatile semiconductor memory according to claim 1, wherein the memory cell driving portion has a reference current generating circuit for generating a first reference current corresponding to the first deciding condition and a second reference current corresponding to the second deciding condition, and a control portion for driving/controlling the reference current generating circuit.

5. A nonvolatile semiconductor memory according to claim 4, wherein the reference current generating circuit consists of a plurality of transistors whose threshold voltages are different respectively.

6. A nonvolatile semiconductor memory according to claim 4, wherein the reference current generating circuit consists of a reference transistor, a level control transistor connected between a word line and a gate of the reference transistor, and a switching circuit for switching a destination of the reference voltage to any one of the gate of the reference transistor and the level control transistor.

7. A nonvolatile semiconductor memory according to claim 1, wherein the memory cell is a single gate memory cell that stores the charge in an insulating film in response to the data.

8. A nonvolatile semiconductor memory according to claim 1, wherein the memory cell is a floating gate memory cell that stores the charge in a floating gate in response to the data.

9. A nonvolatile semiconductor memory according to claim 1, wherein the memory cell is a memory cell that corresponds to multiple levels, and the first deciding condition and the second deciding condition are set individually every level.

10. A nonvolatile semiconductor memory operating method of executing data writing or data erasing in a nonvolatile memory cell while verifying a data of the nonvolatile memory cell, comprising:

a first decision process of reading the data from the memory cell under a first deciding condition to decide pass/fail, and applying a signal to the memory cell to change an amount of charge stored in the memory cell if the data is decided as fail; and a second decision process of reading the data from the memory cell under a second deciding condition, which is relaxed rather than the first deciding condition, to decide the pass/fail;

wherein processes are repeated from the first decision process when the data is decided as fail in the second decision process.

* * * * *